US007452748B1

(12) United States Patent
Craig et al.

(10) Patent No.: US 7,452,748 B1
(45) Date of Patent: Nov. 18, 2008

(54) STRAP ASSEMBLY COMPRISING FUNCTIONAL BLOCK DEPOSITED THEREIN AND METHOD OF MAKING SAME

(75) Inventors: Gordon S. W. Craig, Palo Alto, CA (US); Ali A. Tootoonchi, San Jose, CA (US); Scott Herrmann, Hollister, CA (US); Glenn Gengel, Hollister, CA (US); Randy Eisenhardt, Fargo, ND (US)

(73) Assignee: Alien Technology Corporation, Morgan Hill, CA (US)

( * ) Notice: Subject to any disclaimer, the term of this patent is extended or adjusted under 35 U.S.C. 154(b) by 396 days.

(21) Appl. No.: 11/159,550

(22) Filed: Jun. 22, 2005

Related U.S. Application Data

(60) Provisional application No. 60/626,241, filed on Nov. 8, 2004.

(51) Int. Cl.
*H01L 21/44* (2006.01)
(52) U.S. Cl. .................. 438/108; 257/E21.511
(58) Field of Classification Search .......... 438/107, 438/108, 113, 128, 456; 29/846; 257/E21.511
See application file for complete search history.

(56) References Cited

U.S. PATENT DOCUMENTS

| | | | |
|---|---|---|---|
| 4,670,770 A | 6/1987 | Tai | |
| 4,818,855 A | 4/1989 | Mongeon et al. | |
| 4,857,893 A | 8/1989 | Carroll | |
| 4,937,653 A | 6/1990 | Blonder et al. | |
| 4,990,462 A | 2/1991 | Sliwa, Jr. et al. | |
| 5,008,213 A | 4/1991 | Kolesar et al. | |
| 5,032,896 A | 7/1991 | Little et al. | |
| 5,048,179 A | 9/1991 | Shindo et al. | |
| 5,083,697 A | 1/1992 | Difrancesco | |
| 5,099,227 A | 3/1992 | Geiszler et al. | |
| 5,138,436 A | 8/1992 | Koepf et al. | |
| 5,188,984 A | 2/1993 | Nischiguchi | |

(Continued)

FOREIGN PATENT DOCUMENTS

DE 199 29 610 C1 10/2000

(Continued)

OTHER PUBLICATIONS

C. Curtis, et al. "Metallizations by Direct-Write Inkjet Printing" *National Renewable Energy Laboratory*, NREL/CP-520-31020, Golden Colorado, Oct. 2001 (pp. 1-6).

(Continued)

*Primary Examiner*—Quoc D Hoang
(74) *Attorney, Agent, or Firm*—Blakely, Sokoloff, Taylor & Zafman LLP

(57) ABSTRACT

Methods and apparatuses for an electronic assembly. The method comprises depositing a functional block into a recessed region, forming dielectric layer selectively over at least one of a selected portion of the functional block and a selected portion of the first substrate; and forming one or more electrical interconnections to the functional block. The recessed region is formed on a first substrate. The depositing of the functional block occurs on a continuous web line and using a Fluidic Self Assembly process. The functional block has a width-depth aspect ratio that substantially matches a width-depth aspect ratio of said recessed region which is one of equal to or less than 10.5:1, and equal to or less than 7.5:1.

36 Claims, 27 Drawing Sheets

U.S. PATENT DOCUMENTS

| | | |
|---|---|---|
| 5,205,032 A | 4/1993 | Kuroda et al. |
| 5,212,625 A | 5/1993 | van Andel et al. |
| 5,221,831 A | 6/1993 | Geiszler |
| D343,261 S | 1/1994 | Eberhardt |
| 5,298,685 A | 3/1994 | Bindra et al. |
| 5,353,498 A | 10/1994 | Fillion et al. |
| D353,343 S | 12/1994 | Eberhardt |
| 5,378,880 A | 1/1995 | Eberhardt |
| 5,382,784 A | 1/1995 | Eberhardt |
| 5,382,952 A | 1/1995 | Miller |
| 5,420,757 A | 5/1995 | Eberhardt et al. |
| 5,422,513 A | 6/1995 | Marcinkiewicz et al. |
| 5,430,441 A | 7/1995 | Bickley et al. |
| 5,435,057 A | 7/1995 | Bindra et al. |
| 5,444,223 A | 8/1995 | Blama |
| RE35,119 E | 12/1995 | Blonder |
| 5,514,613 A | 5/1996 | Santadrea et al. |
| 5,517,752 A | 5/1996 | Sakata et al. |
| 5,528,222 A | 6/1996 | Moskowitz et al. |
| 5,545,291 A | 8/1996 | Smith et al. |
| 5,556,441 A | 9/1996 | Courtwright |
| 5,557,470 A | 9/1996 | Shibayama |
| 5,565,846 A | 10/1996 | Geiszler et al. |
| 5,574,470 A | 11/1996 | deVall |
| D378,578 S | 3/1997 | Eberhardt |
| 5,682,143 A | 10/1997 | Brady et al. |
| 5,707,902 A | 1/1998 | Chang et al. |
| 5,708,419 A | 1/1998 | Isaacson et al. |
| 5,715,594 A | 2/1998 | Patterson et al. |
| 5,745,984 A | 5/1998 | Cole, Jr. et al. |
| 5,754,110 A | 5/1998 | Appalucci et al. |
| 5,779,839 A | 7/1998 | Tuttle et al. |
| 5,783,856 A | 7/1998 | Smith et al. |
| 5,798,050 A | 8/1998 | Gaynes et al. |
| 5,818,348 A | 10/1998 | Walczak et al. |
| 5,824,186 A | 10/1998 | Smith et al. |
| 5,904,545 A | 5/1999 | Smith et al. |
| 5,910,770 A | 6/1999 | Ohara |
| 5,914,862 A | 6/1999 | Ferguson et al. |
| 5,995,006 A | 11/1999 | Walsh |
| 6,018,299 A | 1/2000 | Eberhardt |
| 6,019,284 A | 2/2000 | Freeman et al. |
| 6,031,450 A | 2/2000 | Huang |
| 6,040,773 A | 3/2000 | Vega et al. |
| 6,064,116 A | 5/2000 | Akram |
| 6,078,791 A | 6/2000 | Tuttle et al. |
| 6,091,332 A | 7/2000 | Eberhardt et al. |
| 6,094,138 A | 7/2000 | Eberhardt et al. |
| 6,094,173 A | 7/2000 | Nylander |
| 6,100,804 A | 8/2000 | Brady et al. |
| 6,107,920 A | 8/2000 | Eberhardt et al. |
| 6,122,492 A | 9/2000 | Sears |
| 6,133,833 A | 10/2000 | Sidlauskas et al. |
| 6,133,835 A | 10/2000 | De Leeuw et al. |
| 6,134,130 A | 10/2000 | Connell et al. |
| 6,147,605 A | 11/2000 | Vega et al. |
| 6,147,662 A | 11/2000 | Grabau et al. |
| 6,164,551 A | 12/2000 | Altwasser |
| 6,181,287 B1 | 1/2001 | Beigel |
| 6,189,208 B1 | 2/2001 | Estes et al. |
| 6,194,119 B1 | 2/2001 | Wolk et al. |
| 6,195,858 B1 | 3/2001 | Ferguson et al. |
| 6,204,163 B1 | 3/2001 | Panchou et al. |
| 6,206,282 B1 | 3/2001 | Hayes, Sr. et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,229,442 B1 | 5/2001 | Rolin et al. |
| 6,236,316 B1 | 5/2001 | Eberhardt et al. |
| 6,246,327 B1 | 6/2001 | Eberhardt |
| 6,252,508 B1 | 6/2001 | Vega et al. |
| 6,262,692 B1 | 7/2001 | Babb |
| 6,265,977 B1 | 7/2001 | Vega et al. |
| 6,268,796 B1 | 7/2001 | Gnadinger et al. |
| 6,274,508 B1 | 8/2001 | Jacobsen et al. |
| 6,275,156 B1 | 8/2001 | Rasband |
| 6,275,681 B1 | 8/2001 | Vega et al. |
| 6,281,038 B1 | 8/2001 | Jacobsen et al. |
| 6,282,407 B1 | 8/2001 | Vega et al. |
| 6,291,896 B1 | 9/2001 | Smith |
| 6,297,072 B1 | 10/2001 | Tilmans et al. |
| 6,309,912 B1 | 10/2001 | Chiou et al. |
| 6,313,747 B2 | 11/2001 | Imaichi et al. |
| 6,320,543 B1 | 11/2001 | Ohata et al. |
| 6,320,753 B1 | 11/2001 | Launay |
| 6,329,917 B1 | 12/2001 | Leonard |
| 6,357,005 B1 | 3/2002 | Devaux et al. |
| 6,366,468 B1 | 4/2002 | Pan |
| 6,384,425 B1 | 5/2002 | Huber et al. |
| 6,392,213 B1 | 5/2002 | Martorana et al. |
| 6,410,415 B1 | 6/2002 | Estes et al. |
| 6,417,025 B1 | 7/2002 | Gengel et al. |
| 6,420,266 B1 | 7/2002 | Smith et al. |
| 6,448,109 B1 | 9/2002 | Karpman |
| 6,528,351 B1 | 3/2003 | Nathan et al. |
| 6,530,649 B1 | 3/2003 | Pan |
| 6,536,674 B2 | 3/2003 | Kayanakis et al. |
| 6,542,444 B1 | 4/2003 | Rutsche |
| 6,559,666 B2 | 5/2003 | Bernier et al. |
| 6,590,346 B1 | 7/2003 | Hadley et al. |
| 6,606,247 B2 | 8/2003 | Credelle et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,690,598 B2 * | 2/2004 | Oguchi et al. ............... 365/145 |
| 6,696,785 B2 | 2/2004 | Shimoda et al. |
| 6,727,970 B2 | 4/2004 | Grace et al. |
| 6,779,733 B2 | 8/2004 | Akita et al. |
| 6,780,696 B1 | 8/2004 | Schatz |
| 6,794,221 B2 | 9/2004 | Sayyah |
| 6,816,380 B2 | 11/2004 | Credelle et al. |
| 6,841,419 B2 | 1/2005 | Akita et al. |
| 6,844,673 B1 | 1/2005 | Bernkopf |
| 6,853,087 B2 | 2/2005 | Neuhaus et al. |
| 6,856,086 B2 | 2/2005 | Grace et al. |
| 6,863,219 B1 | 3/2005 | Jacobsen et al. |
| 6,864,570 B2 | 3/2005 | Smith |
| 6,867,983 B2 | 3/2005 | Liu et al. |
| 6,908,295 B2 | 6/2005 | Thielman et al. |
| 6,919,680 B2 | 7/2005 | Shimoda et al. |
| 6,957,481 B1 | 10/2005 | Patrice |
| 7,109,867 B2 | 9/2006 | Forster |
| 7,214,569 B2 | 5/2007 | Swindlehurst et al. |
| 7,244,326 B2 | 7/2007 | Craig et al. |
| 7,261,829 B2 * | 8/2007 | Efferenn et al. ............... 216/38 |
| 7,324,061 B1 | 1/2008 | Hadley |
| 7,353,598 B2 | 4/2008 | Craig et al. |
| 2001/0000631 A1 | 5/2001 | Zandman et al. |
| 2001/0031514 A1 | 10/2001 | Smith |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith |
| 2002/0114587 A1 | 8/2002 | Golwaker et al. |
| 2002/0127864 A1 | 9/2002 | Smith et al. |
| 2002/0149107 A1 | 10/2002 | Chang et al. |
| 2003/0029921 A1 | 2/2003 | Akita et al. |
| 2003/0034400 A1 | 2/2003 | Han et al. |
| 2003/0054881 A1 | 3/2003 | Hedrick et al. |
| 2003/0136503 A1 | 7/2003 | Green |

| | | | |
|---|---|---|---|
| 2003/0148555 | A1 | 8/2003 | Akita et al. |
| 2003/0232174 | A1 | 12/2003 | Chang et al. |
| 2004/0005494 | A1 | 1/2004 | Forester et al. |
| 2004/0026754 | A1 | 2/2004 | Peikang et al. |
| 2004/0037053 | A1 | 2/2004 | Akita et al. |
| 2004/0052202 | A1 | 3/2004 | Brollier |
| 2004/0052203 | A1 | 3/2004 | Brollier |
| 2004/0183182 | A1 | 9/2004 | Swindlehurst et al. |
| 2005/0040994 | A1 | 2/2005 | Mazoki et al. |
| 2006/0012482 | A1 | 1/2006 | Zalud et al. |
| 2006/0094168 | A1* | 5/2006 | Hoffman et al. ............ 438/149 |
| 2006/0118229 | A1 | 6/2006 | Ohashi et al. |

FOREIGN PATENT DOCUMENTS

| | | |
|---|---|---|
| EP | 0 992 939 A1 | 4/2000 |
| EP | 1 014 302 A1 | 6/2000 |
| EP | 1 167 068 | 1/2002 |
| EP | 1381080 A2 | 1/2004 |
| JP | 11353439 A | 12/1999 |
| JP | 2001175837 A | 6/2001 |
| JP | 2003242471 | 8/2003 |
| WO | WO 99/41701 A2 | 8/1999 |
| WO | WO 00/52109 | 9/2000 |
| WO | WO 01/33621 A2 | 5/2001 |
| WO | WO 01/75789 A1 | 10/2001 |
| WO | WO 02/097724 A1 | 12/2002 |
| WO | WO 03/030245 | 4/2003 |
| WO | WO 03/063211 | 7/2003 |
| WO | WO 2004/097731 A2 | 11/2004 |

OTHER PUBLICATIONS

B. Derby, "Direct Write of Functional materials by Ink-Jet Printing" *Manchester Materials Science Centre*, The University of Manchester, (pp. 1-19).

A. Pique, et al. "Direct Writing of Electronic and Sensor Materials Using a Laser Transfer Technique" *Material Research Society*, J. Mater. Res., vol. 15, No. 9, Sep. 2000, (pp. 1872-1875).

Kriebel, Frank (2005). RFID Chip and Tag Assembly challenges: Low Cost RFID IC Packaging and Assembly Workshop, Nov. 14, 2005, Munich, Germany. (12pgs).

PCT International Search Report for PCT Application No. PCT/US2005/002534. Mailed on Nov. 11, 2005, (7 pages).

PCT International Written Opinion, PCT Application No. PCT/US03/02115 (4 pages).

PCT Invitation to Pay Additional Fees for International Appln No. PCT/US05/040410, mailed on Aug. 11, 2006 (9 pgs).

PCT Notification Concerning Transmittal of International Preliminary Report on Patentability (Chapter 1 of the Patent Cooperation Treaty) Intl. Application No. PCT/US2005/040410, Mailed on May 18, 2007 (21 pages).

PCT Notification of Transmittal of International Preliminary Examination Report for PCT International Application No. US02/16474, mailed Jul. 21, 2005, (5 pages).

PCT Notification of Transmittal of the International Search Report and the Written Opinion of the International Searching Authority, or the Declaration, International Appln No. PCT/US05/040410, mailed on Nov. 9, 2006 (30 pgs).

PCT Written Opinion Report for PCT Application No. PCT/US2005/002534. Mailed on Nov. 11, 2005, (7 pages).

Curtis, C. et al. "Metallizations by Direct-Write Inkjet Printing" *National Renewable Energy Laboratory*, NREL/CP-520-31020, Golden Colorado, Oct. 2001 (pp. 1-6).

Derby B., "Direct Write of Functional materials by Ink-Jet Printing" *Manchester Materials Science Centre*, The University of Manchester, (pp. 1-19).

Pique, A., et al. "Direct Writing of Electronic and Sensor Materials Using a Laser Transfer Technique" *Material Research Society*, J. Mater. Res., vol. 15, No. 9, Sep. 2000, (pp. 1872-1875).

* cited by examiner

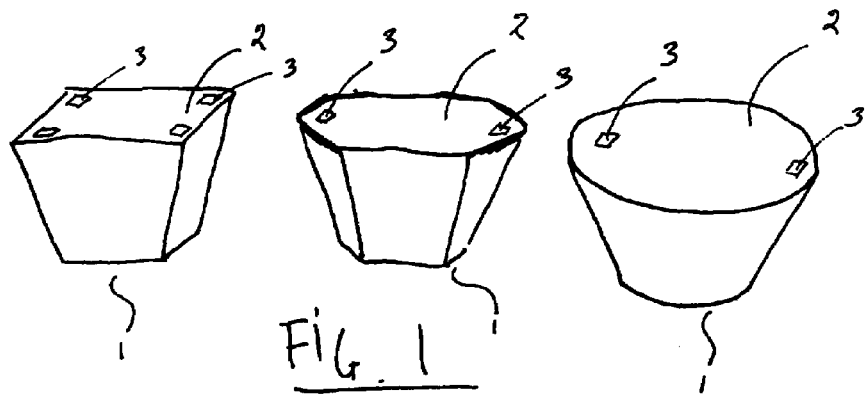
FIG. 1
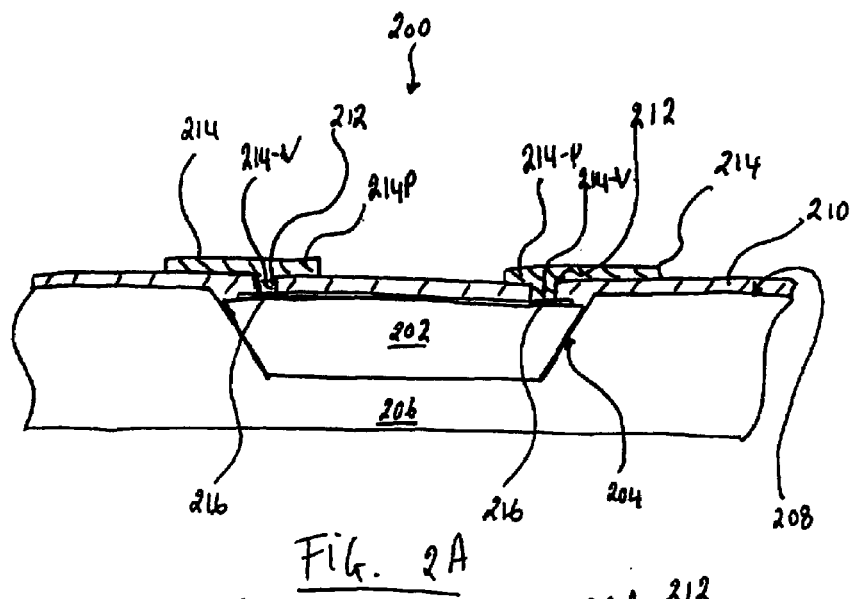
FIG. 2A
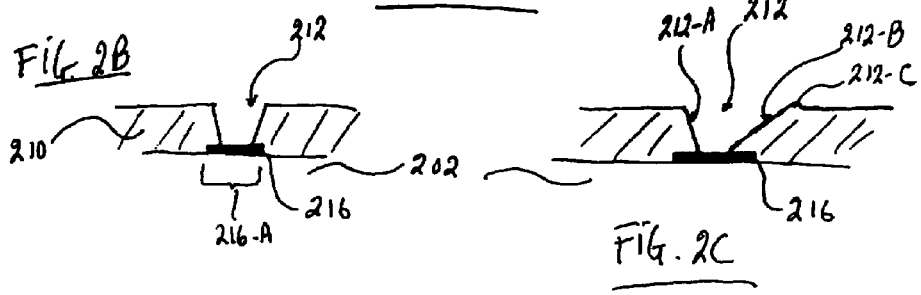
FIG. 2B
FIG. 2C

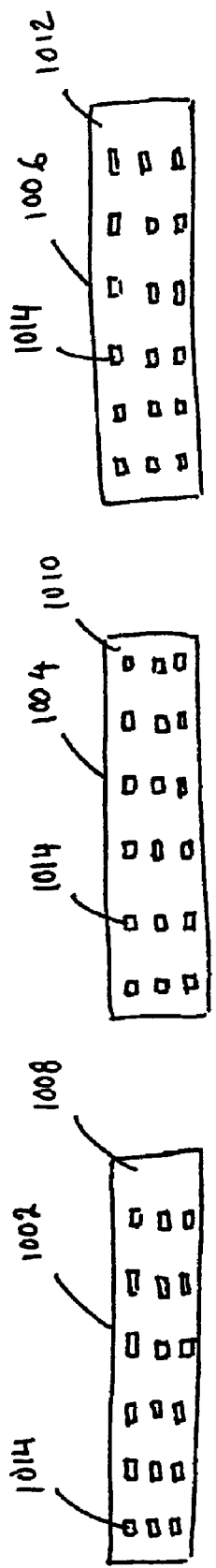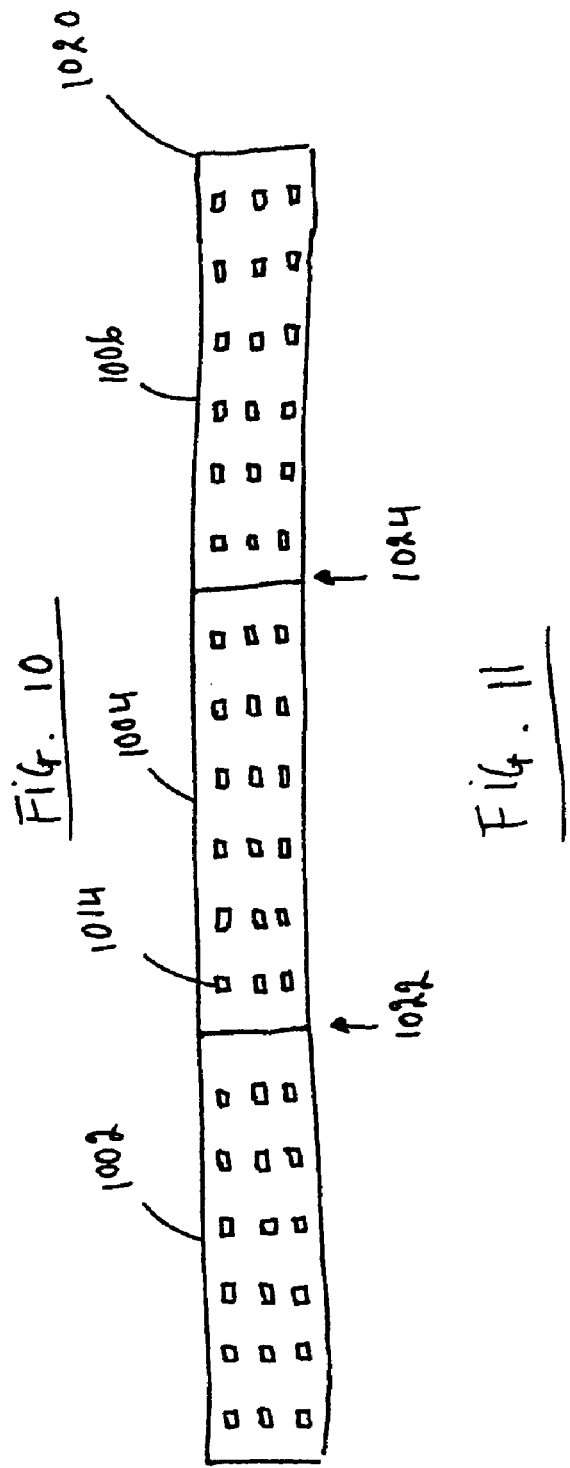
Fig. 10
Fig. 11

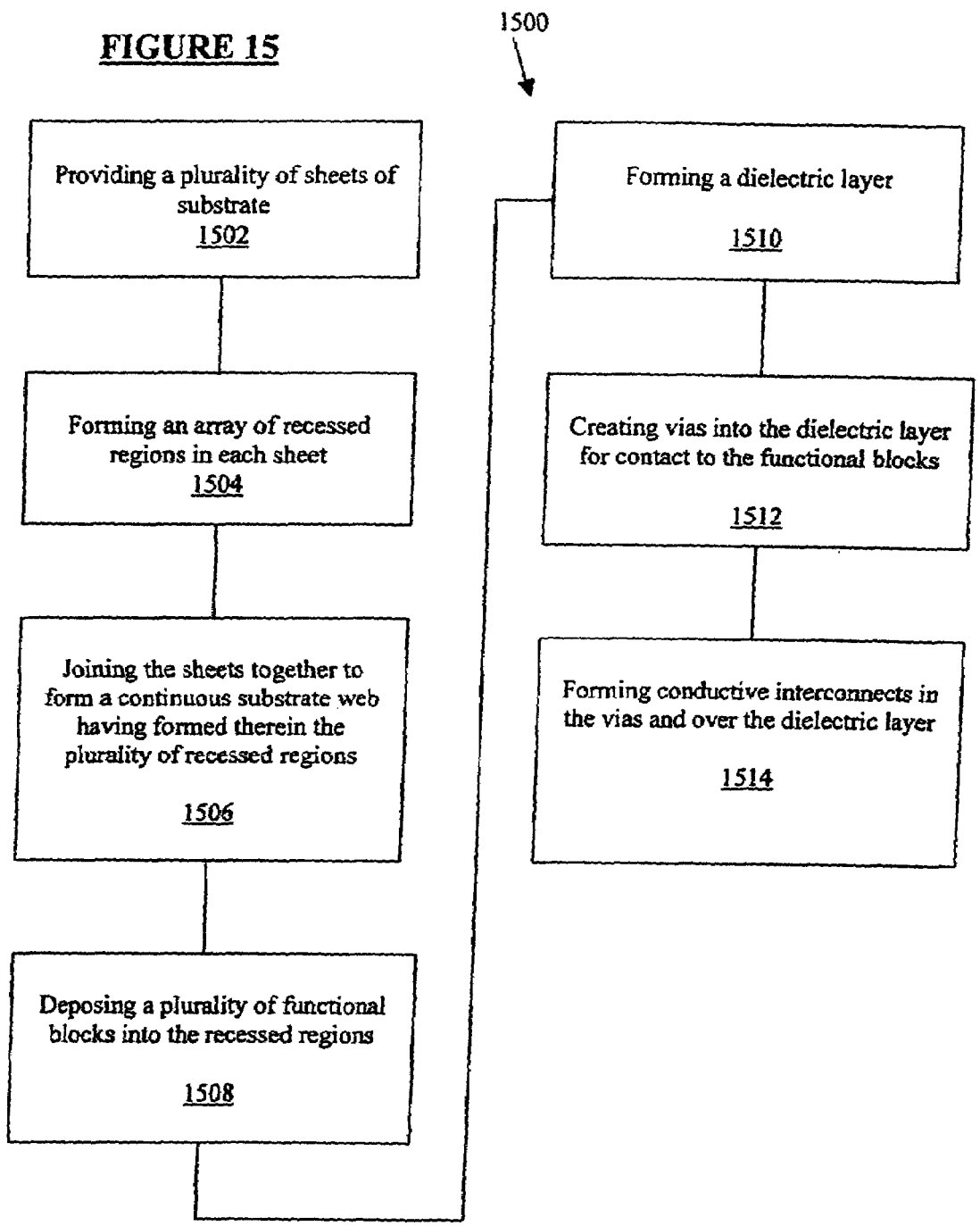

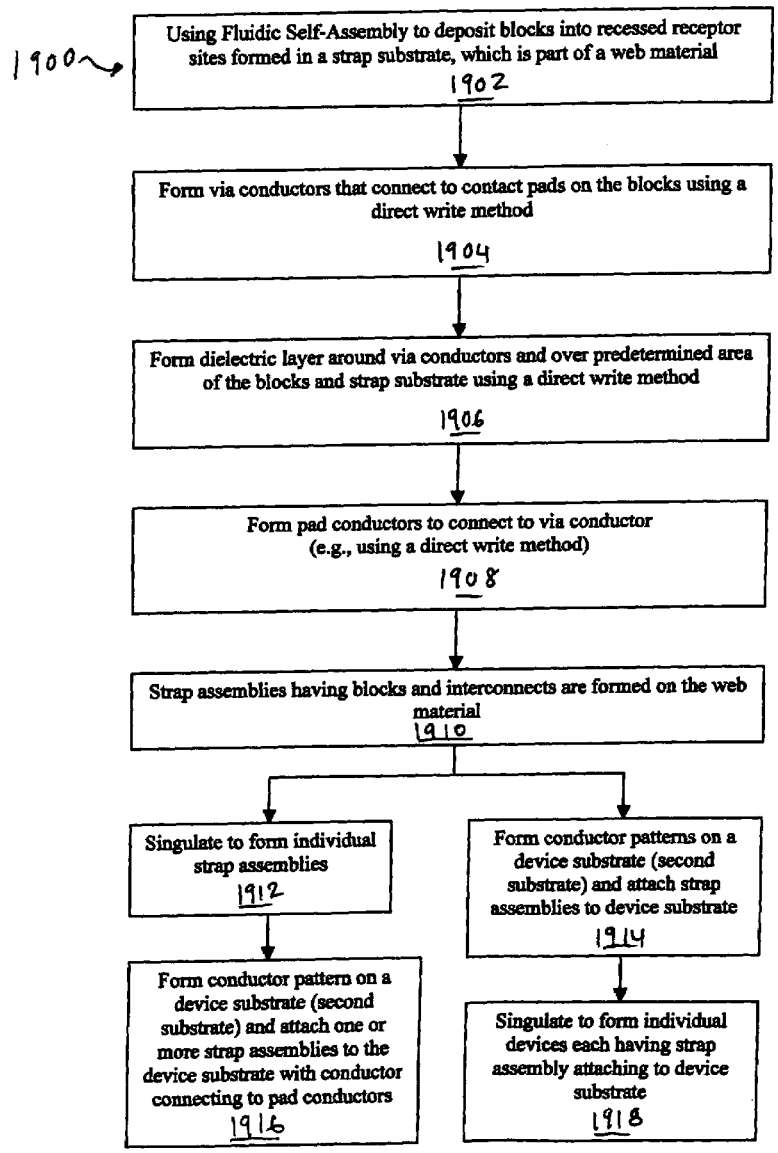

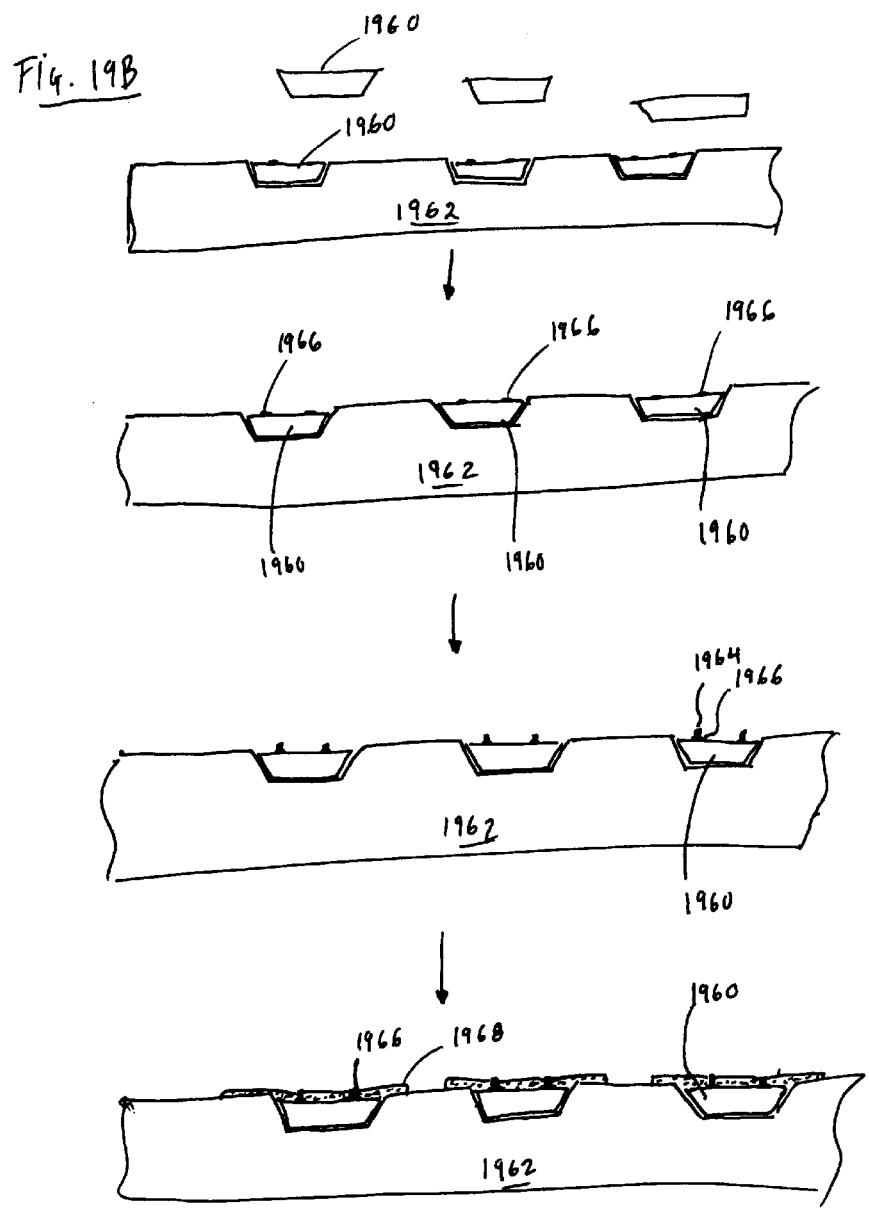

STRAP ASSEMBLY COMPRISING FUNCTIONAL BLOCK DEPOSITED THEREIN AND METHOD OF MAKING SAME

RELATED APPLICATION

This application is related to and claims the benefit of U.S. Provisional Patent application Ser. No. 60/626,241 filed Nov. 8, 2004, which is hereby incorporated by reference in its entirety. This application is also related to co-pending U.S. patent application Ser. Nos. 11/159,526 and 11/159,574 filed on the same day with this application, Jun. 22, 2005, which are hereby incorporated by reference in their entireties.

FIELD

The present invention relates generally to the field of fabricating electronic devices with small functional elements deposited in a substrate.

BACKGROUND

There are many examples of functional blocks or components that can provide, produce, or detect electromagnetic or electronic signals or other characteristics. The functional blocks are typically objects, microstructures, or microelements with integrated circuits built therein or thereon. These functional blocks have many applications and uses. The functional components can be used as an array of display drivers in a display where many pixels or sub-pixels are formed with an array of electronic elements. For example, an active matrix liquid crystal display includes an array of many pixels or sub-pixels which are fabricated using amorphous silicon or polysilicon circuit elements. Additionally, a billboard display or a signage display such as store displays and airport signs are also among the many electronic devices employing these functional components.

Functional components have also been used to make other electronic devices. One example of such use is that of a radio frequency (RF) identification tag (RFID tag) which contains a functional block or several blocks each having a necessary circuit element. Information is recorded into these blocks, which is then transferred to a base station. Typically, this is accomplished as the RFID tag, in response to a coded RF signal received from the base station, functions to cause the RFID tag to reflect the incident RF carrier back to the base station thereby transferring the information. Such RFID tags are being incorporated into many commercial items for uses such as tracking and authenticating the items.

The functional components may also be incorporated into substrates to make displays such as flat panel displays, liquid crystal displays (LCDs), active matrix LCDs, and passive matrix LCDs. Making LCDs has become increasingly difficult because it is challenging to produce LCDs with high yields. Furthermore, the packaging of driver circuits has become increasingly difficult as the resolution of the LCD increases. The packaged driver elements are also relatively large and occupy valuable space in a product, which results in larger and heavier products.

Demand for functional components has expanded dramatically. Clearly, the functional components have been applied to make many electronic devices, for instance, the making of microprocessors, memories, power transistors, super capacitors, displays, x-ray detector panels, solar cell arrays, memory arrays, long wavelength detector arrays, phased array antennas, RFID tags, chemical sensors, electromagnetic radiation sensors, thermal sensors, pressure sensors, or the like. The growth for the use of functional components, however, has been inhibited by the high cost of assembling the functional components into substrates and fabricating final devices or end products that incorporate the functional components.

Often the assembling of these components requires complex and multiple processes thereby causing the price of the end product to be expensive. Furthermore, the manufacturing of these components is costly under the current method because of inefficient and wasteful uses of the technologies and the materials used to make these products.

Many aspects such as substrates' materials, characteristics, dimensions, and/or functional blocks' dimensions and characteristics, and the like, impact the efficiency and cost of assembling the functional components into substrates. Accurate dimension and parameter control of these aspects are crucial for efficiency while reducing cost for assembling electronic devices containing functional blocks deposited therein.

SUMMARY

Embodiments of the present invention provide methods that can lead to efficient fabrications of an electronic assembly that incorporates a functional component or block.

In one aspect of the invention, a strap assembly is fabricated. One or more recessed receptor sites (regions) are formed into a strap substrate. One or more functional or integrated circuit blocks are deposited into the recessed receptor sites, for example, using a Fluidic Self-Assembly (FSA) process. Electrical interconnections are created to enable connection to the functional blocks. After the functional blocks are deposited into the respective receptor sites in the strap substrate and the necessary interconnections formed, the strap assembly is then attached to another substrate, which may comprise a set of patterned or printed conductor (e.g., elements or parts of an antenna for an RFID device).

To form the electrical interconnections, in one embodiment, a local printing method coupled with a guidance system is used to increase the resolution of the interconnections. A print head is used for the local printing method. One or more electrical contacts to the functional blocks can be made using this local printing method. The guidance system can be an optical system that recognizes features on the strap substrate to provide alignment of a print head. An electrical, magnetic, or mechanical mechanism can also be used to provide improved alignment as well. The local printing method includes thermal jet printing, piezoelectric jet printing, acoustic jet printing, extrusion of a material (stencil printing), or other printing methods. It should be recognized that it is possible to group multiple local printing methods with multiple print heads, with each print head depositing a printed material, so that more than one region of a substrate can be printed on at the same time.

In another aspect of the invention, the guidance system is used to improve the registration of the printing of the interconnections of the strap substrate. In another aspect of the invention, a combination of local printing, laser cutting, and a guidance system are used to repair bad circuit elements in the strap substrate.

In another aspect, a testing method, which could comprise an optical, electrical, or mechanical means, is used to determine areas of the strap substrate in which a portion of the functional blocks are known to be, or suspected to be, faulty.

A laser can be used to cut, deplete, or otherwise render the damaged area ready for a subsequent printing or deposition step, including the deposition of another integrated circuit element.

In another aspect of the invention, a printing method with a guidance system is used to deposit a dielectric (non-conductive) material over selected areas of the functional block and/or the strap substrate. The dielectric material functions as an insulation as well as used to tack down, trap, or adhere the functional block that is within a recessed receptor region and/or the integrated circuit on the block. Further processing of the strap substrate and final device can then be performed with minimal risk of the integrated circuit or functional block becoming detached from the substrate.

One aspect of the invention pertains to a method that comprises depositing a functional block into a recessed region; forming a dielectric layer selectively over a selected portion or selected portions of the functional block and the first substrate; and forming one or more electrical interconnections to the functional block. The recessed region is formed on a first substrate. Depositing the blocks occurs on a continuous web line and using a Fluidic Self Assembly process. The functional block has a width-depth aspect ratio that substantially matches a width-depth aspect ratio of the recessed region, which is equal to or less than 10.5:1. Alternatively, the width-depth aspect ratio of the recessed region is equal to or less than 7.5:1.

One aspect of the invention pertains to a method that comprises depositing a functional block onto a web substrate using a Fluidic Self Assembly process; using a direct writing process to form a dielectric layer over the functional block and the web substrate at selected areas; and forming one or more interconnects to the functional block. The web substrate has a recessed region configured to receive the functional block. In one embodiment, depositing the functional block, forming the dielectric layer, and forming the interconnects all occur on a same machine.

One aspect of the invention pertains to a processing system used for assemble functional blocks into a strap substrate. The processing system comprises a web-processing line configured to move a roll of substrate material across one or more processing stations; a Fluidic Self-Assembly device configured to deposit a functional into a recessed region formed in the substrate material; a first direct write device configured to formed interconnection features to and from the functional block; and a second direct write device configured to selectively form a dielectric layer over the functional block and the substrate material. The system may further comprise a vibration device positioned to exert a vibrational force on one or both of the substrate material and a slurry that is dispensed via the FSA device to dispense the functional block onto the substrate material. The vibration device facilitates deposition of functional block. The system may further comprise an embossing device configured to create the recessed region into the substrate material. Additionally, a computer system may be included and which is set up to control the web-processing line, the FSA device, the first direct writing device, and/or the second direct writing device, and other devices associated with the processing system.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings:

FIG. 1 illustrates an example of a functional component block;

FIGS. 10-11 illustrate a plurality of sheets being joined together to form a long sheet of substrate with recessed regions in accordance with embodiments of the present invention;

FIGS. 13, 14A-14B, and 15 illustrate exemplary methods of making an electronic assembly with functional block in accordance to embodiments of the present invention;

FIGS. 16-17, 18A-18B, and 19A-19C illustrate exemplary methods of making an electronic assembly with functional block incorporating direct writing technique in accordance to embodiments of the present invention;

DETAILED DESCRIPTION

Figure 2D:
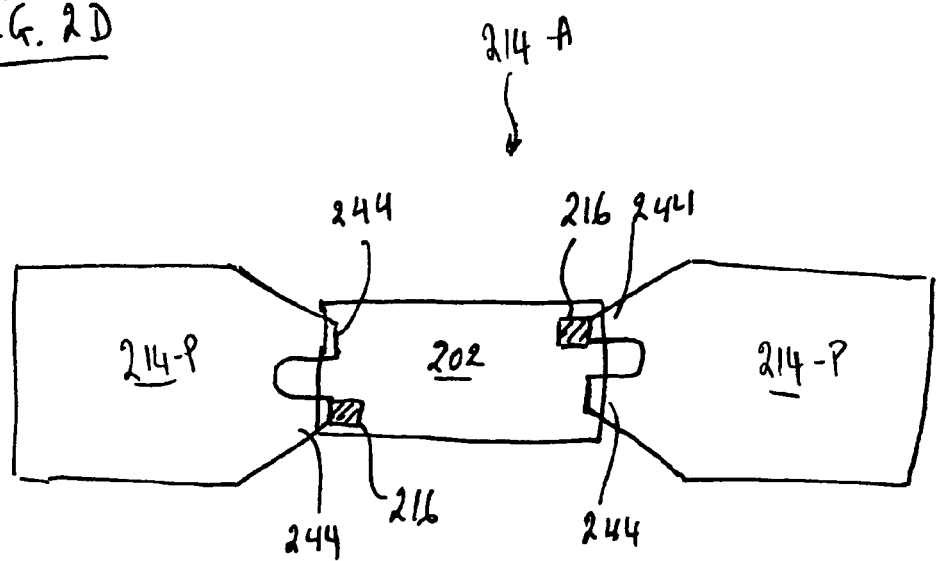
FIGS. 2D, 2E(a)-2E(b) and 2F illustrate exemplary embodiments of a conductive interconnect coupling to a functional block.

In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

Embodiments of the present invention relate to methods for forming holes, openings, or recessed regions in a substrate or web substrate and depositing functional blocks into the recessed regions, forming layers, and/or electrical interconnections to the blocks to form electronic assemblies. On many occasions, the disclosure refers to the substrate with one or more functional blocks deposited therein as a "strap assembly." Electronic devices that can be formed using embodiments include a display, a smart card, a sensor, an electronic tag, an RFID tag, etc. Some embodiments of the present invention also relate to characteristics and features of the substrates or the substrate materials that the functional blocks are deposited therein. Some embodiments of the present invention also relate to feature dimensions and specifics of the functional blocks with respect to the substrate and the recessed regions.

Embodiments of the invention apply to both flexible and rigid substrates, and to both monolayer and multilayer substrates. By creating recessed regions in a substrate, the substrate is able to receive a functional block or functional blocks that may have a circuit element thereon. In some embodiments, the substrate includes one functional block. In many embodiments, the substrate includes a plurality of such recessed regions for a plurality of such functional blocks. Typically the blocks are contained in a slurry, which is deposited onto the flexible substrate as is typically done in a Fluidic Self-Assembly (FSA) process. Although the blocks may be comprised of single crystal silicon or other like material, which makes the block rigid, the substrate may still be flexible because the size of these blocks (e.g., 650×500 µm or 850×850 µm) is small, or significantly small, in comparison to the flexible substrate (e.g., 3×6 mm or larger). In some embodiments, the flexible substrate forms part of an RFID tag, a merchandise label, a packaging, a pharmaceutical label/seal, a currency (money), or a display backplane, to name a few example applications.

Many devices are made from a combination of a strap substrate and another substrate (or a receiving substrate or a device substrate). Such devices may include an RFID tags, a display, a smart card, a sensor, an electronic tag, or a sensor device. A device with a strap substrate combined to another substrate are described in U.S. Pat. No. 6,606,247, which is hereby incorporated herein by reference. In one example of this combination, the strap substrate is fabricated with one or more recessed receptor sites, and one or more functional or integrated circuit blocks are deposited into the recessed receptor sites, for example, using a Fluidic Self-Assembly (FSA) process. The functional blocks may be deposited by one or more FSA operations, by robotic pick-and-place operations, or by other methods. After a functional block is deposited into the corresponding strap substrate, the strap substrate is then attached to another substrate, which may comprise a set of patterned or printed conductor. The conductor can be an electrical element of a device; for instance, the conductor can be elements or parts of an antenna for an RFID device. More than one functional block may be deposited into a strap substrate depending on application.

A strap assembly is formed when one or more functional blocks are deposited in the strap substrate and other elements (e.g., dielectric layer and electrical interconnection) formed thereon. The overall manufacturing process of a strap assembly impacts the cost of the final device that incorporates the strap assembly. For example, when a strap assembly is formed using a web process, efficiencies of the block deposition, dielectric film formation, material usage, or electrical interconnection fabrication play important roles in the final device cost and performance.

FIG. 1 illustrates exemplary embodiments of an object that is functional component block 1. The functional block 1 can have various shapes and sizes. Each functional block 1 has a top surface 2 upon which a circuit element is situated (not shown). The circuit element on the top surface 2 may be an ordinary integrated circuit (IC) for any particular function. For example, the IC may be designed to drive a pixel of a display. The IC may also be designed to receive power from another circuit, such as an antenna, and perform a particular function or functions for the operation of a passive RFID tag. Alternatively, the IC may be designed to receive power from an energy source (e.g. battery) for the operation of an active RFID tag. The functional block 1 also includes a contact pad 3 (one or more contact pads 3) to allow electrical interconnection to the circuit element on the block 1. The functional block 1 can have a trapezoidal, rectangular, square, cylinder, asymmetrical, or asymmetrical shape. The top of the block 1 is often (but need not be) wider than the bottom of the block 1. Each functional block 1 may be created from a host substrate and separated from the host substrate. Methods of making a functional block 1 are known in the art and for instance, can be found U.S. Pat. Nos. 5,783,856; 5,824,186; 5,904,545; 5,545,291; and 6,291,896, which are hereby incorporated by reference in their entireties.

FIG. 2A illustrates a cross-sectional view of an exemplary embodiment of an electronic assembly (or a strap assembly) 200. The assembly 200 can be part of or made to incorporate into a display device, a RFID tag, a merchandise label (a CD label), a pharmaceutical label or bottle, etc. The assembly 200 can be attached to another substrate (e.g., a device substrate) that may have patterned, printed, or formed thereon a conductor or conductors. A functional block 202 is deposited in recessed region 204 of a substrate 206 to form the assembly 200. The functional block 202 can be the functional block 1 previously discussed. Methods of making a functional block are known in the art. In one embodiment, the functional block 202 is a NanoBlock™ made by Alien Technology. Once deposited, the functional block 202 is recessed below a surface 208 of the substrate 206. In one embodiment, the functional block 202 is recessed sufficiently below the surface 208 to provide sufficient space for electrical connection to the functional block 202. In one embodiment, the functional block 202 is deposited into the recessed region 204 using a Fluidic Self-Assembly (FSA) process. The surface 208 of the substrate 206 is the native surface of the substrate 206 before any deposition of any other materials on top of the surface 208. The substrate 206 may be a flexible substrate made out of plastic, fabric, metal, or some other suitable materials. In one embodiment, the substrate 206 is flexible. In one embodiment, the assembly 200 is flexible.

Also shown in FIG. 2A, a dielectric layer 210 is formed over the surface 208 and over the functional block 202. The dielectric layer 210 in many instances, also functions as a planarization layer as well as a layer that traps or keeps the functional block 202 in the recessed region 204. Vias 212 are also formed into the dielectric layer 210 to expose portions of the functional block 202. Typically, each of the exposed portions of the functional block 202 comprises a contact pad 216 that enables electrical interconnection to the functional block 202. In one embodiment, the functional block 202 includes two contact pads 216 placed on opposite sides and/or diagonal to each other. In such embodiments, the dielectric layer 210 has two vias 212, one for each contact pad 216. Each via 212 exposes some or all of the top area 216-A of the corresponding contact pad 216 (FIGS. 2B-2C). In one embodiment, as shown in FIG. 2B each via 212 has a diameter that is smaller than the top area 216-A of the corresponding contact pad 216. In some embodiment, the via 212 has a cone-like shape where the via 212 has a top diameter and a bottom diameter. The bottom diameter is smaller than the top diameter. In one embodiment, the bottom diameter is at least 20% smaller than the contact pad 216. Optimally, the diameter of the via 212 at the bottom should be no more than 80% of the width of the contact pad 216, which may be defined by the area 216A. Most optimally, it should be no more than 60% of the width of the contact pad 216, which may be defined by the area 216A. In one embodiment, the via 212 has a non-symmetrical cone-like shape in which one side of the via 212 has a flatter or gentler slope than the other side (FIG. 2C). As shown in FIG. 2C, the via 212 has two sides, 212-A and 212-B, in which the side 212-B has a more "gentle" or flatter slope than the side 212-A. In one embodiment, a small protrusion 212-C is formed on the side 212-B of the via 212. The configuration of the via 212 in accordance to the present embodiment helps the conductive material to more easily fill the via 212.

In one embodiment, the dielectric film 210 is deposited using a roll-to-roll process over the substrate 206 that has the functional block 202 deposited therein. The dielectric film 210 may be deposited using methods such as lamination of a polymer film or coating of a liquid layer over the substrate 206 and subsequent curing to form the dielectric film 210. In one embodiment, the dielectric film 210 is deposited by a wet coating process, such as comma coating, or by a direct writing process, and subsequently dried or cured. The dielectric film 210 may be necessary in embodiments where the assembly 200 is used for devices such as RFID tag since the dielectric film 210 provides good RF performance for the RFID tag. The dielectric film 210 contains at least one opening formed through the dielectric film for the via 212. Each via 212 enables the conductive interconnect 214 formed on the top of and into the dielectric film 210 to make electrical connection with a contact pad 216 on the functional block 202. Each conductive interconnect 214 can be one conductor or two conductors joined together. The conductive interconnect 214 can be formed in a one-step process or a two-step process. When the conductive interconnect 21 is made of two (2) conductors, one conductor is referred to as a "via conductor" (214-V) since it fills the via 212. The other conductor is referred to a "pad conductor" (214-P) which sits on a portion of the dielectric layer 210 and connects or joins the via conductor 214-V.

Each via 212 in the dielectric film 210 is positioned over a contact pad 216, such that the via 212 enables interconnection from the contact pad 216 on the functional block 202 to the interconnect 214. In one embodiment, each via 212 is formed such that no dielectric material is present in the via 212.

In many embodiments, there are two (2) (or more) vias 212 created over each functional block 202. The number of vias 212 can be increased or decreased depending on the product. The number of vias 212 also depends on how many contact pads 216 are present in the functional block 202 or depending on how many electrical connections are needed. For example, many more dielectric vias may be needed for embodiments where the assembly 200 is incorporated into display driver or sensor applications. In one embodiment, there are two contact pads 216 on the functional block 202 and the contact pads are situated diagonally to each other. In such embodiment, the dielectric film 210 has two vias 212 which are also situated diagonally to each other over the corresponding contact pads 216.

In one embodiment, the dielectric film 210 has a thickness ranging from about 5 μm to about 60 μm. In another embodiment, the thickness of the dielectric film 210 is approximately 38 μm. The dielectric can be formed either as a wet film that is dried or cured, or as a dry film that is laminated onto the substrate 206.

In one embodiment, the dielectric film 210 has an adhesive functionality to the side that is applied to the substrate 206. The adhesive functionality could be an inherent property of the dielectric material or its application process, or it could be due to an adhesive film that is applied to the side of the dielectric film 210 that comes in contact with the substrate 206. In embodiments where an adhesive film is used to provide the adhesive to the dielectric film 210, the adhesive film is non-conductive and can be processed to achieve the desired structure for the via 212. For example, the adhesive film may be photo imageable or laser drillable to allow the via 212 to be formed. A laser drillable adhesive film could be fabricated by using an adhesive that inherently absorbs UV light, or else by using an adhesive formulation that consists of a UV-absorbing species. A photo-imageable or laser-drillable adhesive might also enable direct electrical contact to the contact pad without an intermediate cleaning or de-scum process. If an adhesive film is used on the dielectric film 210, all of the dimensions listed for the dielectric film 210, including film thickness and via diameter, applies to the dielectric and adhesive film combined together.

In one embodiment, the dielectric film 210 has a coefficient of thermal expansion (CTE) that is closely matched to that of the substrate 206. Preferably, the CTE is within ±20 ppm/° C. of the CTE of the base material of the substrate 206, which is typically 50-70 ppm/° C., but can vary depending on the substrate. The proximity of the dielectric film CTE to the substrate film CTE is more important than the absolute value of the substrate film CTE. Suitable dielectric materials include, but are not limited to, polyimide, polyetherimide, liquid crystal polymer, and polyethylenenaphthalate.

In one embodiment, the vias 212 in the dielectric film 210 are formed over corner areas of the functional block 202. In one embodiment, the vias 212 are only formed over the corners of the functional blocks with the contact pads 216. Additionally, the dielectric film 210 may also be formed only in discrete or selected positions on or around the functional block 202 and around the area of the substrate 206 that has the functional block 202 deposited therein. When the dielectric film 210 is discretely or selectively formed, the vias 212 may not be necessary since the dielectric material may be selected to not form over the contact pads 216 to leave the contact pads 216 exposed. A method that can be used for selectively or discretely forming the dielectric film 210 includes direct write, such as ink-jet, and laser assisted deposition, etc. Such method enables the deposition of the dielectric film 210 anywhere the material is needed. Additionally, such selective deposition of the dielectric film 210 enables customizing deposition of the dielectric film for uses such as bridging or covering the gap from the functional block 202 to the substrate surface 208, and/or to protect sensitive areas on the functional block 202. Such selective deposition of the dielectric film 210 minimizes the use of the dielectric material where it is not needed. Other methods that can be used for selectively or discretely form the dielectric film 210 include patterning, etching, and photolithography.

One advantage of a structure that incorporates a via or vias and a dielectric layer is that the dielectric layer is necessarily disposed between the functional block, which can be an integrated circuit (IC) for a device, and the conductive interconnect or conductive traces, which could be used to connect the functional block to an external electronic element such as an antenna. The via through the dielectric material provides a direct electrical connection to the IC, but there is still a capacitive coupling between other parts of the functional blocks and the external electronic element. It is disadvantageous to have such capacitive coupling between the IC and the conductive traces, and this capacitive coupling is increased due to proximity of the conductive traces to the IC. Placing the dielectric layer between the functional block and the external electronic element provides some vertical distance between them. Minimizing the size of the interconnection pad, and increasing the vertical distance between the traces and IC, minimizes this capacitive coupling. Additionally, the use of low dielectric constant materials as the dielectric layer will also minimize this capacitive coupling. Examples of low-dielectric constant materials include porous materials, fluorinated materials, and silicon-rich materials.

In one embodiment, each conductive interconnect 214 formed on top of and into (in a via created in the dielectric layer 208) the dielectric layer 208 fills a particular vias 212 so as to establish electrical interconnection to the functional block 202. In the present embodiment, each conductive interconnect 214 constitutes both a via conductor 214-V as well as a pad conductor 214-P. When each of the conductive interconnects 214 fills via 212, the conductive material covers all of the exposed area of the contact pad 216 that is exposed by the via 212. In one embodiment, the conductive interconnect 214 constitutes a conductive trace of an antenna element or acts as an interconnect for an antenna element. The conductive interconnect 214 can also interconnect the functional block 202 to an external electrical element or elements (e.g., antennas or electrodes). The conductive interconnect 214 can also be an electrical or conductive lead from the external electrical element.

In one embodiment, the conductive interconnect 214 is formed using a roll-to-roll process. For example, materials used to form the interconnect 214 is deposited onto and into the dielectric layer 208 as the substrate 208 is processed on a web line. Material used to make the conductive interconnect 214 may be selected such that it can be cured, for example, by heat or by electromagnetic or ultraviolet radiation, and can be used in the roll-to-roll process. For example, the interconnect 214 material is cured as the substrate 206 is processed on a web line. In one embodiment the conductive interconnect 214 is made of a conductive composite of conductive particles in a non-conductive matrix, such as silver ink. In another embodiment, the conductive interconnect 214 is made of metal or metals that are evaporated onto the substrate 206 or onto the dielectric layer 210, over the corresponding via 212, and subsequently patterned. The conductive interconnect 214 can also be comprised of an organic conductor, or composites of carbon nanotubes or inorganic nanowires dispersed in a binder. In one embodiment the conductive interconnect 214 is made of a conductive composite, such as silver ink or silver-filled epoxy that completely filled by the corresponding vias 212. In one embodiment, the conductive interconnect 214 is made of one or more of the following: conductive particles dispersed in a nonconductive or an organometallic matrix (e.g., silver ink), sputtered or evaporated metal, conductive carbon composite, carbon nanotubes, inorganic nanowires dispersed in a nonconductive matrix, and any of these materials combined with metallic nanoparticles. In one embodiment, the conductive interconnect 214 comprises a nonconductive matrix that consists of a thermoplastic polymer, a thermoset polymer, or a B-staged thermoset polymer. In one embodiment, the elastic modulus of a conductive composite that is used to form the conductive interconnect 214 is between 120,000 psi and 60,000 psi. The resistivity of the conductive interconnect 214 is less than 76 mΩ/square/mil, more optimally, less than 60 mΩsquare/mil, even more optimally less than 42 mΩ/square/mil, and most optimally less than 25 mΩ/square/mil.

Additionally, the conductive interconnect 214 is made of a material that is able to maintain good electrical contact to the top-most conductive feature or features (e.g., the contact pad 216) on the functional block 202, such that the combination of the substrate 206, the functional block 202, the dielectric layer 210, the contact pad 216, and the conductive interconnect 214 is able to maintain sufficient electrical contact throughout, with less than a 10% variation in total resistance. In one embodiment, the combination of the substrate 206, the functional block 202, the dielectric layer 210, the contact pad 216, and the conductive interconnect 214 is able to maintain sufficient electrical contact throughout, with less than a 10% variation in total resistance, when the assembly 200 is subjected to thermal cycles for 100 times from −40° C. to 85° C., and bent over a 1-inch-diameter mandrel for 80-100 times. Each conductive interconnect 214 can partially or completely cover the corresponding via 212 for the conductive material in the via 212 to make electrical contact to the functional block 202 or the corresponding contact pad 216 on the functional block 202. Additionally, the conductive interconnects 214 also have a good adhesion to the dielectric film 210, such that the interconnects can survive flexing over a 1-inch mandrel as previously mentioned.

In one embodiment, the conductive interconnect 214 is coupled to another conductive trace (not shown) that may be formed on the substrate 206. Such conductive trace can be an antenna trace, for example, when the assembly 200 is to be incorporated into an RFID tag. Alternatively, the conductive interconnect 214 also forms the conductive trace for the final device itself. For example, the conductive interconnect 214 can also be part of an antenna element for an RFID tag. The conductive interconnect 214 and the conductive trace could be combined as one material applied in one process, or as two materials applied in two sequential steps.

In one embodiment, the interconnect 214 constitutes a via conductor 214-V and a pad conductor 214-P connecting to a particular contact pad 216. The via conductor 214-V contacts the conductive pad 216 on the functional block 202 at the bottom of the via 212. It is preferable that the via conductor 214-V covers all of the contact pad 216 that is exposed by the via 212.

In one embodiment, the top diameter or the top area of the via conductor 214-V is larger than the top diameter of the corresponding via 212. In one embodiment, the top diameter or the top area of the via conductor 214-V is about 1-3 times larger than the top diameter of the via 212. In another embodiment, top diameter or the top area of the via conductor 214-V is 1-2 times larger than the top diameter of the via 212.

The pad conductor 214-P, in one embodiment, provides a large or larger conductive area for fast electrical attachment of the assembly 200 to a conductor on another electrical functional element, such as a RFID antenna, a display driver strip, or a sensor assembly. In one embodiment, the pad conductor 214-P is at least (1 mM)×(1 mm) large. Since this interconnection area is larger than the connection or contact pad 216 on the functional block 202, lower-cost, lower-precision equipment can be used to produce electrical contact between the assembly 200 and other functional elements such as antennas. The pad conductor 214-P may be made of the same material or different material as the via conductor 214-V.

Figure 2E:
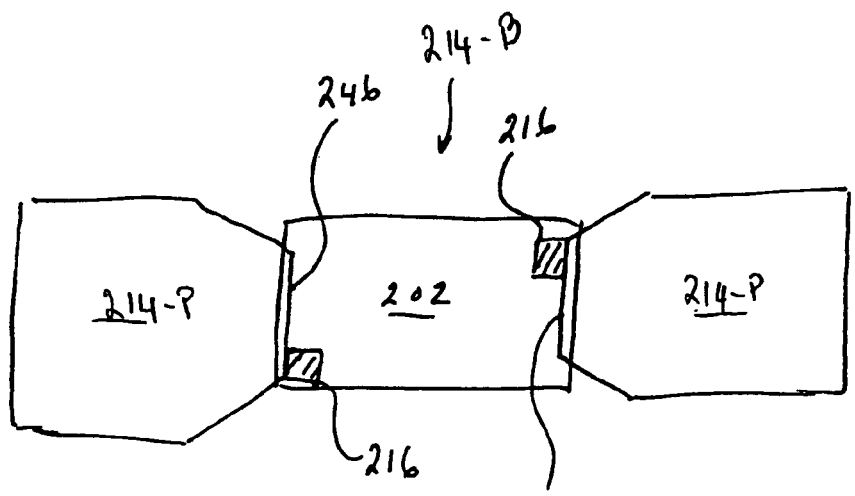
Figure 2E:
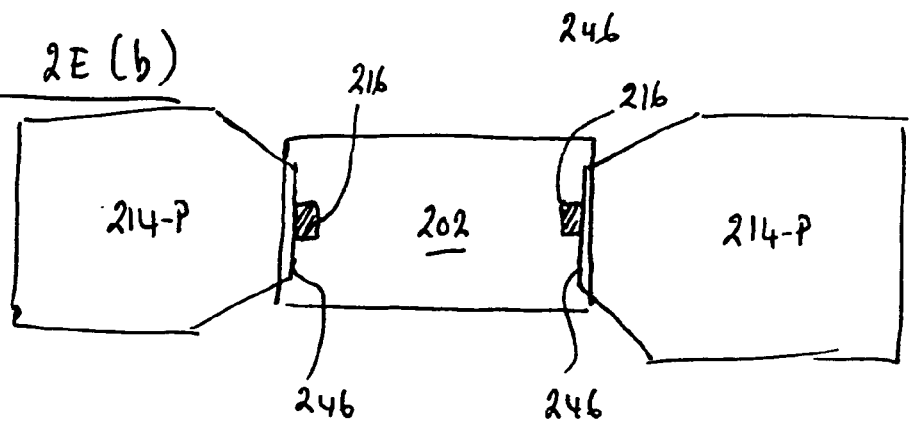
Figure 2F:
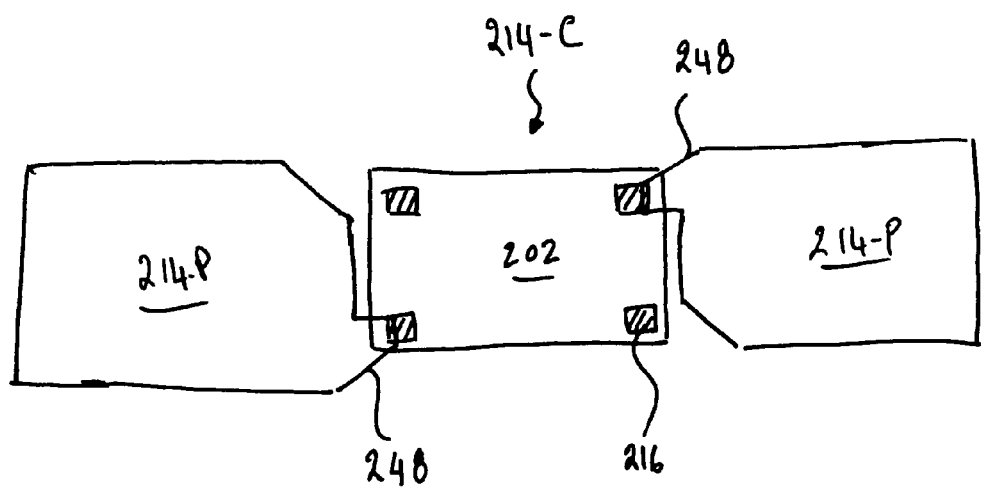
FIG. 2A illustrates an exemplary embodiment of an electronic assembly with a functional block deposited in a substrate.
FIGS. 2B-2C illustrate exemplary embodiments of a via formed in a dielectric layer that is formed over a functional block.
FIG. 2G illustrates an exemplary embodiment of incorporating the assembly formed in FIG. 2A to a second substrate (a device substrate)

The pad conductor 214-P must make electrical contact with any necessary conductive material in the via 212 (e.g., the via conductor 214-V) as well as the corresponding contact pad 216 that may be provided on the functional block 202. The conductive interconnect 214 may have several layouts. Exemplary layouts are shown in FIGS. 2D-2F, below. The layouts in FIGS. 2D-2F illustrate exemplary configurations for the pad conductor 214-P of the conductive interconnects 214. It is to be noted that other configurations are also feasible.

Typically, the assembly 200 includes more than one interconnections 214 and more than one pad conductor 214-P. For instance, the functional block 202 has two contact pads 216 so that multiple connections are needed. In FIG. 2D, a "bow-tie" configuration 214-A is provided. In this configuration, two pad conductors 214-P form a bow tie-like configuration. The configuration 214-A includes two pad conductors 214-P, each of which having two fingers 244 coming out of each pad conductor. The fingers 244 are able to make contact with each of the contact pad 216 at any of the 4 corners of the functional block 202. Each finger 244 would make contact to a contact pad 216 that is closest to the corresponding finger 244. It is preferred to have a limited amount of conductive interconnect 214 over the functional block 202 such that the amount of stray capacitance is limited. Thus, only a small section of each finger 244 overlaps the functional block 202 or a contact pad 216 provided on the block 202. In one embodiment, the finger 244 is less than or equal to the top diameter of the corresponding contact pad 216 that the finger 244 connects to. In one embodiment, the finger 244 covers a portion of the via conductor that connects to the contact pad 216. In one embodiment, the finger 244 covers all of the via conductor that connects to the contact pad 216. The bow-tie configuration 214-A enables the conductive interconnect 214 to make contact to the functional block 202 where the contact pads 216 is placed on any of the four corners of the functional block 202. It may be that the functional block 202 has one contact pad 216. Thus, not all of the fingers 244 would contact a contact pad 216. The functional block 202 thus can also be deposited into a receptor 204 in a manner where the contact pads 216 can be oriented at any corner and still able to allow contact from the fingers 244 to the contacts pads 216.

In FIGS. 2E (a)-FIG. 2E (b), another "bow-tie" configuration 214-B, which does not have the fingers 244 shown in the bow-tie configuration 214-A is provided. Instead, in the bow-tie configuration 214-B, sides 246 are provided on the pad conductors 214-P where each of the sides 246 runs across almost the length of each side of the functional block 202. In this configuration, two pad conductors 214-P also form a bow tie-like configuration over parts of the functional block 202. In the present embodiment, each of the sides 246 is placed in contact with a contact pad 216 on the functional block 202. The contact pad 216 can be a corner location as shown in FIG. 2E(a) or at a center location as shown in FIG. 2E(b).

FIG. 2F illustrates an exemplary embodiment of a configuration of the conductive interconnect 214 or the pad conductor 214-P with a non-bow-tie configuration 21C. In the present embodiment, the functional block 202 may have contact pads 216 placed diagonally to each other. The configuration 214-C is similar to the configurations 214-A and 214-B above except that only one arm is necessary on each pad. The configuration 214-C is configured with two pad conductors 214-P each having an arm or extension 248 to make connection to one of the contact pads 216. The arm 238 allows the conductive interconnect 214 to contact the functional block 202 with minimal conductive material over the functional block 202. Other configurations or shape for the extension 248 are possible. The configuration 214-C is especially useful when the functional block does not have rotational symmetry that is greater than 2-fold.

In FIGS. 2D-2F, the contact pads 216 are shown to contact the fingers 244 or the sides 246 of the pad conductor. As previously mentioned, the dielectric layer 210 may be formed over the block 202 and the vias 212 are created in the dielectric layer 210 so that the contact pads 216 are exposed. The vias are filled with conductive interconnects 214 or via conductors 214-V as previously mentioned. As previously mentioned, the vias could also be filled by the same material and at the same time as the sides 246 are form. The fingers or sides from the pad conductors 214-P cover at least a portion of the corresponding via conductors 214-V to establish interconnection to the contact pads 216. For the sake of illustrating the pad conductor layouts, the vias 212 and the via conductors 214-V are not shown in FIGS. 2D-2F.

In one embodiment, each pad conductor 214-P has a resistivity that is less than 25 mΩ/square/mil, optimally less than 18 mΩ/square/mil, and most optimally less than 12 mΩ/square/mil.

In one embodiment, each part of the pad conductor part 214-P that is over the via conductor should be no wider than 2 times the smallest diameter of the corresponding via conductor 214-V, optimally no wider than 1.5 times the diameter of the via conductor 214-V, and more optimally, the same width as the widest diameter of the via conductor 214-V.

Figure 2G:
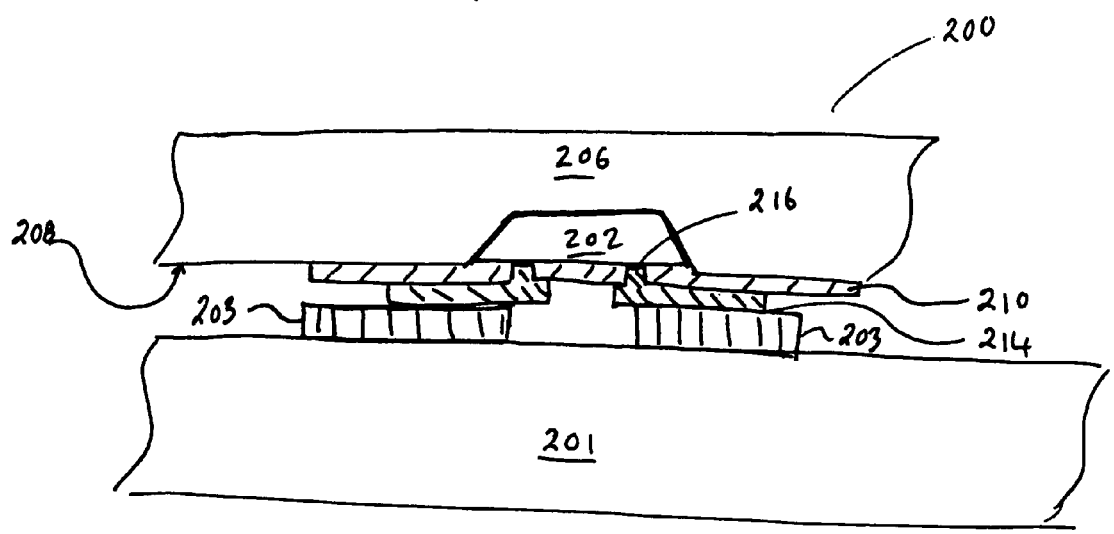

The assembly 200 shown in FIG. 2A can be referred to as a strap assembly. In one embodiment, the strap assembly 200 is further coupled or attached to another device for form a final device (for example, to form an RFID tag). FIG. 2G illustrates a cross-sectional view of the strap assembly 200 being attached to a second substrate or a device substrate 201. The substrate 201 may include other active elements and/or electrical components and in one embodiment, includes a conductor pattern 203 formed thereon. In one embodiment, the conductor pattern 203 is part of an antenna element that can be used for an RFID device. In one embodiment, the substrate 206 is "flipped" over such that the surface 208 is facing the second substrate 201 and the conductor pattern 203. The substrate 206 is attached to the second substrate 201 in a way that the conductor pattern 203 is coupled to the interconnects 214. Conductive adhesives may be used to facilitate the attachment of the strap assembly 200 to the substrate 206. Other sealing materials can also be added.

In one embodiment, the substrate 206 is a monolayer plastic film such as the substrate 206 shown in FIG. 2A. A plastic monolayer base film can be a thermoset or an amorphous or semicrystalline thermoplastic plastic film. In one embodiment, the substrate 206 is a thermoplastic base film and has a glass transition temperature (Tg) of at least about 100° C., more optimally at least about 125° C., and even more optimally at least about 145° C.-150° C. The thermoset plastic film can be selected from UV-curable, moisture-curable, and heat-curable thermoset plastic films. Example of suitable materials that can be used for the substrate 206 include, but are not limited to, polyethylene, polystyrene, polypropylene, polynorbornene, polycarbonate, liquid crystal polymer, polysulfone, polyetherimide, polyamide, polyethylene terephthalate, and polyethylene naphthalate, and derivatives thereof.

Figure 3:
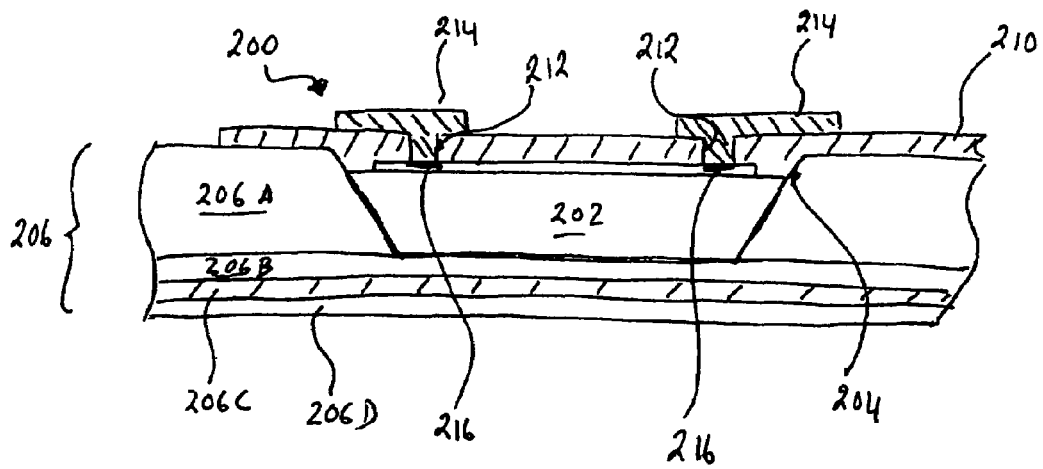
FIG. 3 illustrates an exemplary embodiment of an electronic assembly with a functional block deposited in a substrate that is a multi-layered substrate.

In alternative embodiments, the substrate 206 comprises multiple layers for example, layers 206A-206D, with the recessed regions 204 formed in one of the layers, e.g., the top layer 206A and with the additional layers used to provide one or more of dimensional stability, mechanical strength, dielectric properties, desired thickness, functionalities, etc (FIG. 3).

The substrate 206 is made of a material that minimizes positional distortion of the recessed region 204 after the substrate 206 is subjected to a first thermal excursion for about 30 minutes at about 125° C. Prior to assembling the functional block 202 into the recessed region 204, the substrate 206 is subjected to at least one thermal excursion cycle for about 30 minutes at about 125° C. During this thermal excursion cycle, the recessed region 204 that is formed into the substrate 206 may be distorted positionally. The position of the recessed region 204 on the substrate 206 may move or be distorted slightly due to the heat or change of material characterization due to heat. In one embodiment, the substrate 206 must be made of a material that will cause only about 30-500 µm, more optimally, 30-300 µm, positional distortion to the location of the recessed region 204 that is formed on the substrate 206. Positional distortion refers to the location of the recessed region 204 being moved positionally from the originally created position on the substrate 206. In one embodiment, the substrate has a length of about 200 mm, along which the distortion is measured. Thus, the substrate 206 is made of a material that when subjected to a first thermal excursion causes the recessed region to be move by only about 30-500 µm, or 30-300 µm. In another embodiment, the substrate could have a length that is 300 mm or 500 mm long, and the allowable distortion along such a length would scale linearly with the distortion allowed along a shorter length.

In one embodiment, when the substrate 206 is subjected to a process that forms the recessed region 204, areas around the area where the recessed region 204 is to be formed is maintained at a temperature between about 50° C. and the glass transition temperature of the substrate material. Such temperature control minimizes distortion to the substrate 206 as the recessed region 204 is being formed.

The recessed region 204 is at least as large as the functional block 202 that fills the recessed region 204. More optimally, the recessed region 204 is slightly larger (e.g., 0-10 µm or 1-10 µm) than the functional block 202 in width, depth, and length, and has a sloping sidewall similar to that of the shaped functional block 202. In general, the recessed region matches the shape of the functional block; if the functional block 202 is square, the recessed region 204 is also square, and if the functional block 202 is rectangular, the recessed region 204 is also rectangular.

Figure 4:
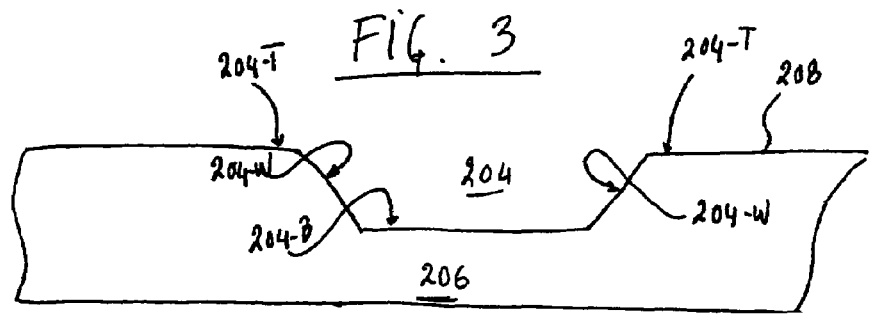
FIGS. 4-5 illustrate aspects of a recessed region formed in a substrate.
Figure 5:
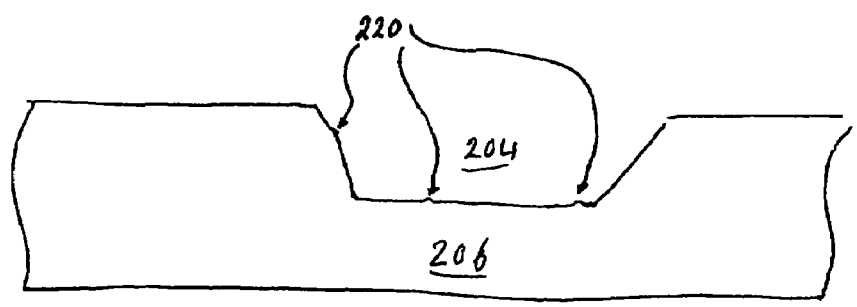

In one embodiment, the substrate 206 is substantially flat, especially in or near the recessed region 204. Substantially flat is characterized by surfaces of the substrate having no protrusion or no protrusion greater than 5 µm. In other words, if there are any protrusions at all, the protrusion is not greater than 5 µm, thus giving the substrate 206 a substantially flat characteristic. FIG. 4 illustrates an exemplary embodiment of the substrate 206 with a top surface 208 that is substantially flat. The substrate 206 only needs to have its top surface 208 (or alternatively, the top surface of the top layer of the substrate 206 when the substrate includes multiple layers) being substantially flat. As shown in FIG. 4, the sides of the recessed region 204 are substantially flat, as well. Thus, top sides 204-T, bottom side 204-B, and sidewalls 204-W of the recessed region 204 are substantially flat with no protrusion. FIG. 5 illustrates an exemplary embodiment of the substrate 206 with some minor protrusions 220 along a surface of the substrate 206. Nevertheless, the protrusions 220 are so minor that the substrate 206 still has the substantially flat characteristic and that the recessed region 204 has sides that are substantially flat.

The recessed region 204 has a width-depth aspect ratio that is configured to substantially match a width-depth aspect ratio of the functional block 202. In one embodiment, the recessed region 204 has a width-depth aspect ratio that is less than 14:1, optimally, less than 10.5:1, and even more optimally, less than 7.5:1. The functional block 202 thus has a similar width-depth aspect ratio.

The substrate 206 is also selected so that the substrate has a good thermal stability to withstand standard processing. The material of the substrate 206 is such that the substrate 206 allows the recessed region 204 to maintain the same positional accuracy requirements previously mentioned. The substrate 206 is made of a material that is able to allow the recessed region 204 to maintain its positional accuracy after going through a 125° C.-150° C. thermal excursion.

In many embodiments, the assembly 200 is cut, sliced, separated, or singulated from a plurality of web-assembled assemblies as will be described below. Thus, a plurality of assemblies 200 can be formed in one short time frame. A roll-to-roll process can be used. A web substrate is provided. The web substrate may be a continuous sheet of web material which when coiled, is a roll form. A plurality of recessed regions 204 is formed into the web material to form the web substrate. A plurality of functional blocks 202 are deposited into the recessed regions 204 on the web substrate (e.g., using an FSA process) to form a plurality of the assemblies 200 shown in FIG. 2A. Areas or strips of the web substrate can later be sliced, singulated, cut, or otherwise separated to produce individual assemblies 200. In one embodiment, a web sheet having a plurality of assemblies 200 is attached to another web substrate similarly to previously described in FIG. 2G. Individual devices can then be formed by slicing or singulating after the substrates are adhered to one another as illustrated in FIG. 2G.

Figure 6A:
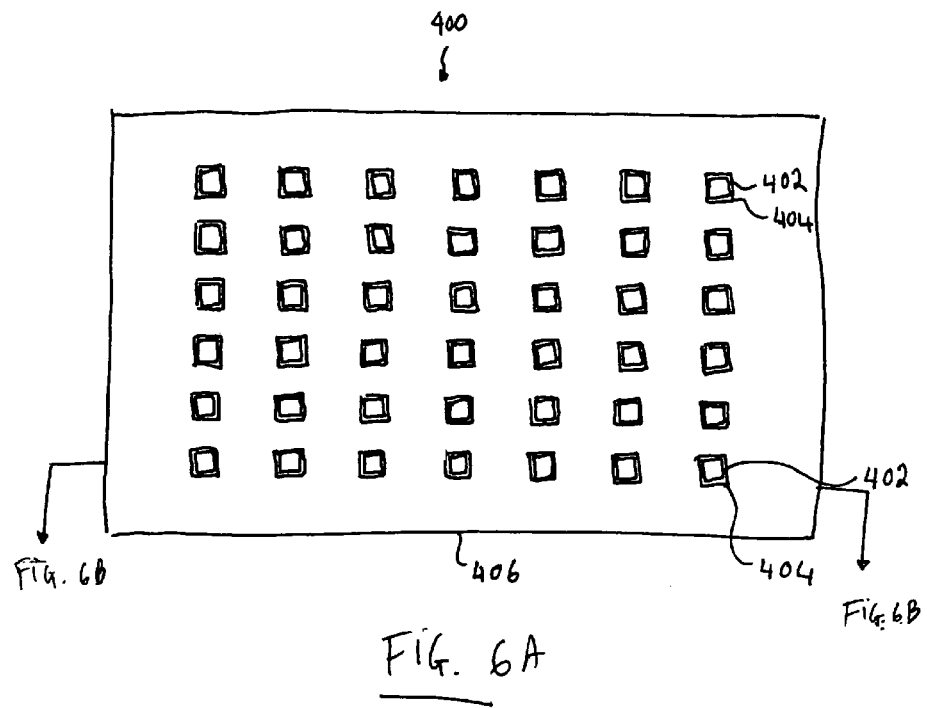
FIG. 6A illustrates an exemplary embodiment of an electronic assembly with multiple functional blocks deposited in a substrate with a plurality of recessed regions.
Figure 6B:
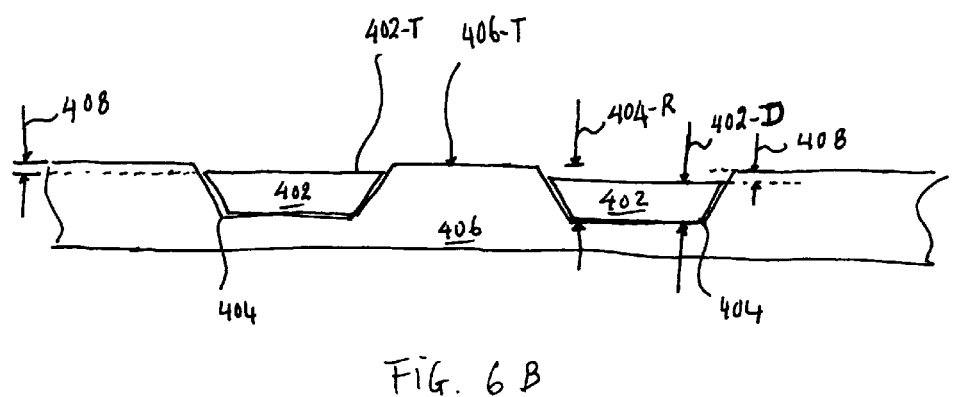
FIG. 6B illustrates an exemplary embodiment of an electronic assembly with multiple functional blocks deposited in a substrate with the functional blocks being recessed below a surface of the substrate.

FIGS. 6A-6B illustrate an assembly 400 that includes several assemblies formed similarly to the assembly 200. The assembly 400 is similar to the assembly 200 above except when multiple assemblies are formed on one piece of substrate material. In FIGS. 6A-6B, a substrate 406 includes a plurality or a population of recessed regions 404 formed therein. Each recessed region 404 includes a functional block 402 deposited therein. The assembly 400 is also similar to the assembly 200 shown above except that there are more of the functional blocks deposited in the substrate. Singulating areas of the substrate 406 after the functional blocks 402 have been deposited and other elements formed thereon can produce a plurality of assemblies 200 shown above. The substrate 406 can be a web substrate, a frame of a web substrate, a section of a web substrate, or a sheet substrate. In some embodiments, all of the available recessed regions 404 in the substrate 406 are filled with functional blocks 402. In some embodiments, 90-100% of the available recessed regions 404 in the substrate 406 are filled with functional blocks 402. In yet other embodiments, 50-100% of the available recessed regions 404 are filled.

The recessed region 404 has a width-depth aspect ratio that is configured to substantially match a width-depth aspect ratio of the functional block 402. In one embodiment, the population of the recessed regions 404 has an average width-depth aspect ratio that substantially matches the average width-depth aspect ratio of the functional blocks 402 or in some case, the width-depth aspect ratio of each of the functional blocks 402. The average width-depth aspect ratio of the population of the recessed region is less than 14:1, optimally, less than 10.5: 1, and even more optimally, less than 7.5:1.

The functional blocks 402 thus have a similar width-depth aspect ratio to the recessed regions' width-depth aspect ratio.

In terms of recessed regions' depth, it is important to take into account the entire population of the depths 404-R of the recessed regions 404 and the thicknesses 402-D of the functional blocks 402. The thickness 402-D of each of the functional blocks 402 should account for any contact pads on top of the functional block 402. In one embodiment, after all the functional blocks 402 are deposited into their corresponding recessed regions 402, a substantial amount of the plurality of functional blocks 402 are recessed below a top surface 406-T of the substrate 406. In one embodiment, there is a gap 408 between the top surface 402-T of the functional block 402 and the top surface 406-T of the substrate 406. In one embodiment, the gap 408 is between about 0-10 μm. In one embodiment, the substantial amount of the functional blocks 402 being recessed below the surface of the substrate 406 is defined by (1) less than 10% of the population of the functional blocks protrude above the top surface 406-T of the substrate 406; (2) less than 1% of the population of the functional blocks 402 protrude above the top surface 406-T of the substrate 406; (3) more than 90% of the functional blocks 402 are recessed below the top surface 406-T of the substrate 406; or (4) more than 99% of the population of the functional blocks 402 are recessed below the top surface 406-T of the substrate 406.

The populations of the depths 404-R of the recessed regions 404 and the thicknesses 402-D of the functional block thickness can be represented by distribution with an average depth or thickness ($\mu_r$ or $\mu_N$, respectively) and a standard deviation ($\sigma_r$ or $\sigma_N$, respectively). The probability that a functional block 402 protrudes up from a recessed region 404 can be determined by comparing the difference ($\Delta$) in averages to the combined standard deviation, $\sigma_c$, where $$\Delta = \mu_r - \mu_N$$

and $$\sigma_c = \sqrt{\sigma_r^2 \sigma_N^2}.$$

It is desirable to have $\sigma_c < \Delta$. More preferably, using the equations above and applying Normal statistics, it is preferable to have $\sigma_c$ and $\Delta$ such that less than 10%, or more preferably less than 1%, of the population of the functional blocks 402 protrude above the top surface 406-T of the recessed regions 404.

In one embodiment, the assembly 400 is characterized in that the locations of the recessed regions 405 on the substrate 406 have a good positional accuracy. In one embodiment, across a 158 mm-wide area of the substrate 406, the positional accuracy of each recessed region 404 is within 100 μm at 3σ, in another embodiment, within 50 μm at 3σ, and in another embodiment, within 30 μm at 3σ. These positional accuracy numbers also scale linearly with the width of the substrate 406. For example, when the substrate 406 has a width of about 316 mm the positional accuracy of the recessed regions 404 is within 200 μm at 3σ. Similar to the assembly 200, the assembly 400 includes a dielectric film formed over the functional blocks 402, vias formed in the dielectric film to expose contact pads on the functional blocks 402, and conductive interconnections to establish electrical connections to the functional blocks 402.

The substrate 206 or 406 with recessed regions previously described can be processed using various exemplary methods and apparatuses of the present invention to form the recessed regions.

Figure 7A:
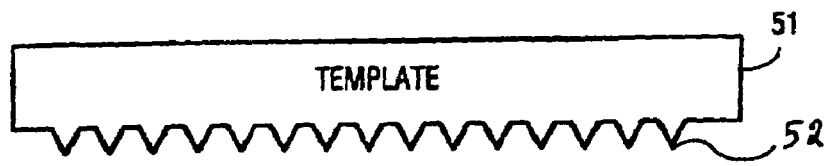
FIGS. 7A-7D illustrate an exemplary embodiment that uses a template to create recessed regions in a substrate.

One embodiment in accordance with the invention includes a substrate in which a roller having protruding features is moved across the substrate and/or pressed down on the substrate. The roller creates holes or recessed regions in the substrate. Another embodiment includes or a substrate that passes under a roller having protruding features and the substrate contacts the protruding structures from the roller. In one embodiment, a template in which structures protrude from the template is used to create recessed regions in a substrate. The template is pressed against the substrate to create recessed regions or holes in the substrate. Another embodiment of the invention relates to creating recessed regions or holes in a web material using either a roller or a template. Another embodiment of the invention relates to creating recessed regions or holes in a web material using either a roller or a template in which heat is also applied to the polymer film to enable the recessed region formation process. In one embodiment, a device with features such as embossing features configured to create recessed regions is used. FIG. 7A shows a template 51 with protruding structures 52. The protruding structures 52 may vary in shapes and sizes depending upon the object that is to be placed into a substrate or web material that is used to create the substrate 406 or 206 previously described. The length of the protruding structure 52 may range from 500 angstroms to 85 microns or larger in some cases. Similarly, the diameter or other dimension (e.g., width) of a protruding structures 52 may range from 100 angstroms to 70 microns to 900 microns or larger in some cases.

In the embodiment where the template 51 is an embossing mold, the protruding structures 52 have feature dimensions and/or pitch that are 0.5-1% larger than the desired dimensions of the corresponding recessed regions to be formed on the substrate. In the present embodiment, the substrate will have the recessed regions formed with a pitch that has substantially similar pitch to the pitch of the recessed regions. The precise dimensions of the final product can thus be controlled. This is necessary so that sufficient alignment occurs through the assembling or fabrication process of the particular apparatus.

In one embodiment, the protruding structure 52 has a width-depth aspect ratio that is less than 10.5:1 or more optimally, less than 7.5:1. Additionally, the protruding structures 52 also have the shape that is the shape of the corresponding functional blocks to be deposited in the recessed regions.

The template 51 is comprised of sturdy materials (e.g., steel, polymers, etc.). In one embodiment, the template is an electroform stamper copy made from an electroform mother copy, which is made from a master mold that is made by either etching a silicon wafer or diamond turning machining a metal plate or roller. In another embodiment, the template is an electroform stamper copy made from a master mold negative that is made by etching a silicon wafer. In another embodiment, the template is an electroform stamper copy made by coupling (e.g., welding or attaching) together smaller electroform stamper copies to make a linear array (for example, x by 1) of stampers, where x>1. In another embodiment, the template is an electroform stamper copy made by welding together smaller electroform stamper copies to make an array (for example, x by y) of stampers, where both x and y are greater than 1.

Figure 7B:
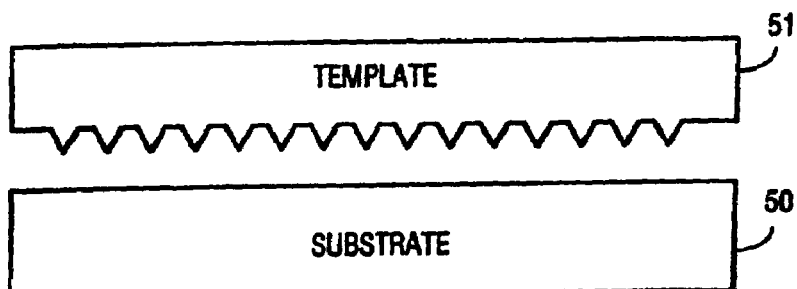
Figure 7C:
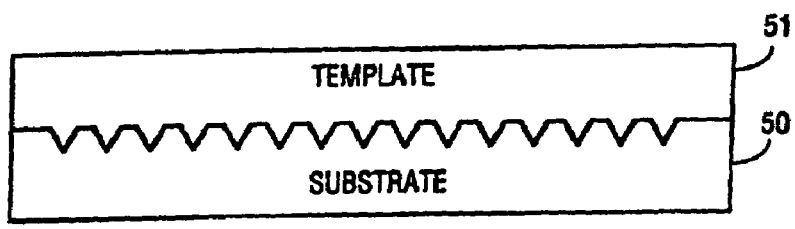
Figure 7D:
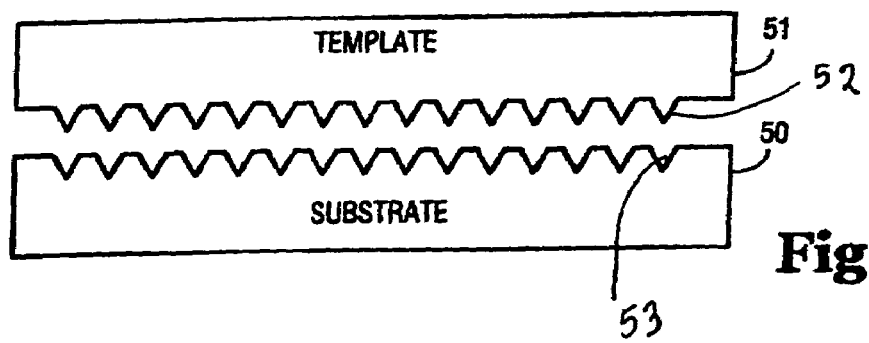

FIG. 7B shows the template 51 with the protruding structures 52 facing one side of a substrate 50. The substrate 50 can be the substrate 406 or 206 previously mentioned. FIG. 7C shows the template 51 contacting the substrate 50 and the protruding structures 52 from the template 51 pierce or press into the substrate 50. These protruding structures 52 may be a variety of shapes depending on the shapes of objects to be deposited onto the substrate 50. Heat, electromagnetic radiation, or UV light may be applied at any point in this process to assist in the pattern transfer. FIG. 7D shows that when the template 51 is separated from the substrate 50, recessed regions or holes 53 are created in the substrate 50. The recessed regions 53 can be the recessed regions 404 or 204 previously mentioned.

The template 51 can be coupled to a vertical hot press and used to create the recessed regions on the substrate 50. The vertical hot press can be configured to move up or down to cause the template 51 to contact the substrate 50 in the manner described above so that the protruding structures 52 can create the recessed regions 53 into the substrate 50. The template 51 can also be configured to be used in a step-and-repeat process to make the substrate 50.

In one embodiment, the substrate 50 is a web substrate that once coiled, has a roll form. When formed from a step-and-repeat process, one area of the substrate 50 is formed at a time by the template 51. Each individual area of the substrate is referred to as a frame. For optimal process conditions, it is important that the web substrate not have unpredictable or uncontrolled ridges, channels, indentations, or step-changes between individual frames of the web substrate. The ridges, channels, indentations, or step-changes between individual frames of the web substrate may cause interruption, disruption, or unpredictable changes in the movement in the flow of the slurry that carries the functional blocks to be deposited into the recessed regions 53 as is used in an FSA process. In one embodiment, a "frame" is approximately 6-inches-long in the material direction of the web substrate, and in other embodiments, a frame can be of any length, ranging from as small as one inch to arbitrarily long, such as 4-feet-long or 8-feet-long or longer.

Figure 7E:
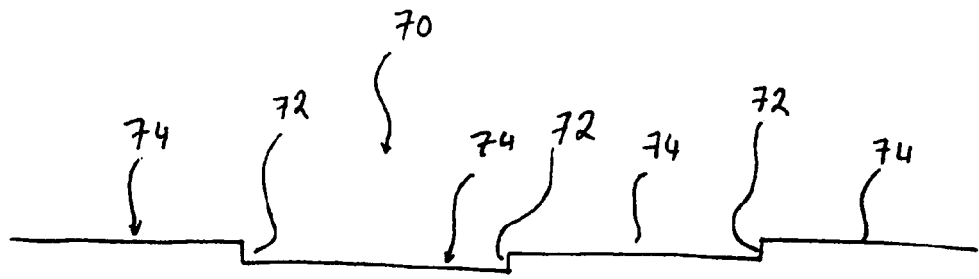
FIGS. 7E-7F illustrate non-uniform or inconsistent step-changes between frames of substrate.
Figure 7F:
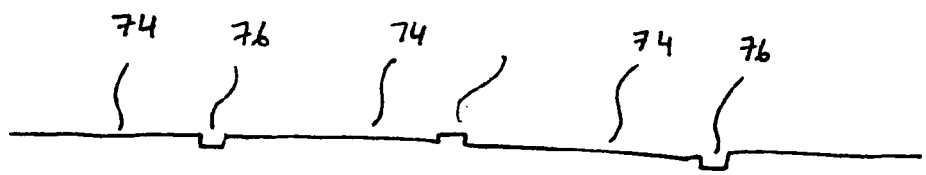

Various embossing techniques use a repeating process in which an embossing tool provided with a template such as the template 51 is pressed against the web substrate at elevated temperature to emboss the recessed regions into the web substrate. Next, the embossing tool is separated from the web substrate and the web substrate is indexed forward one frame-length for the next frame/area. This entire process is repeated for as many frames as necessary to complete the web substrate of a particular length. Such process, and other embossing processes, can leave an uncontrolled step-change between the frames of the web substrate. This step-change can typically be about 10-50 µm tall or taller, 0.5-2 mm wide, and may not be continuous in the cross-direction of the web. FIG. 7E illustrates a cross-sectional view of an example of step-changes created between frames of a web substrate 70. In this figure, the web substrate 70 is processed using a step-and-repeat process in which step-changes 72 are formed between each two frames 74. In many instances, the step-changes 72 are not uniform or continuous in the same direction from frame to frame as shown in FIG. 7E. Similarly, as shown in FIG. 7F, step-changes can include channels or indentations 76 that are formed between frames 74. These types of step-changes should be avoided in the web substrate. These step-changes 72 or 76 unpredictably or uncontrollably interrupt the flow of the functional blocks during the FSA process, and therefore are detrimental to the process.

Many techniques used to form the recessed region in the web substrate can cause similar step-changes. Thus, the types of step-changes mentioned above can be formed in substrates that are processed otherwise and not necessarily results of step-and-repeat processes. For instance, the step-changes may be caused by a continuous belt that may be present in some processing. A roller used to form the recessed regions in the web substrate could have features that may cause similar step-changes in the web substrate. Uncontrolled step-changes are thus not desired for a web substrate whether the substrate is processed by a step-and-repeat process or by a continuous process.

Figure 7G:
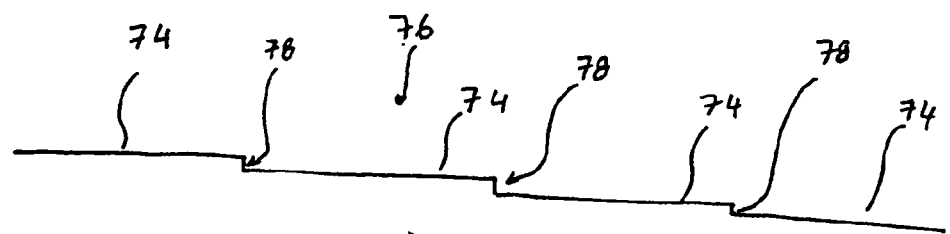
FIGS. 7G-7H illustrate an exemplary embodiment of the present invention with consistent step-changes between frames of substrate.
Figure 7H:
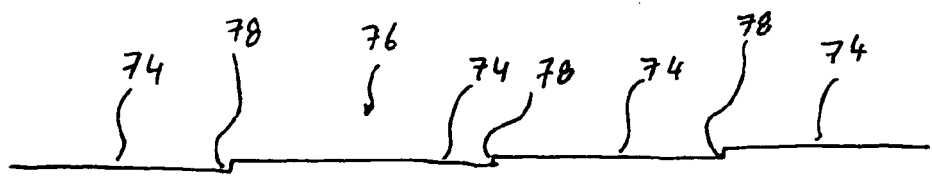

A step-change between frames, however, may be acceptable in the web substrate if the step change is always in the same direction or in a controlled direction. That way, the FSA process can be controlled or monitored accordingly to a predictable presence of a step-change that is always in the same direction. In one embodiment, a step-change is created into the web substrate such that when examining the space between two frames on the web substrate, there is a step going from one frame to the next, and that the step is always higher on the left side, or is always higher on the right side, or always in the same direction. For instance, as illustrated in FIG. 7G, a web substrate 76 is formed such that there are a plurality of frames 74. Each frame 74 is separated from another frame by a step-change 78. The step-change 78 is consistently in the same direction from one frame 74 to the next frame 74. As can be seen, the step-change 78 is always higher on the left side than the right side of the step-change 78. FIG. 7H illustrates another example of a consistent or uniform step-change between two frames of the web substrate 76. One advantage of the consistent step-change is that the flow of FSA slurry is not disrupted by the step-changes 78 unexpectedly and thus, the FSA process can be more controlled. A template used to create the recessed regions may incorporate a feature that can create such a step-change in the substrate.

Figure 7I:
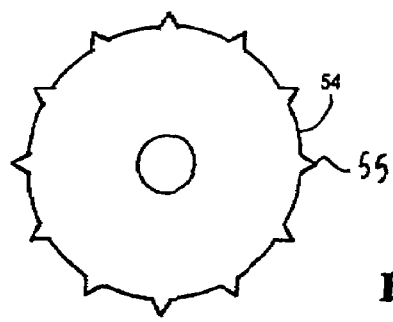
FIGS. 7I-7M illustrate an exemplary embodiment that uses a roller with features to create recessed regions in a substrate.
Figure 7J:
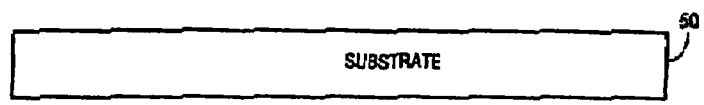
Figure 7K:
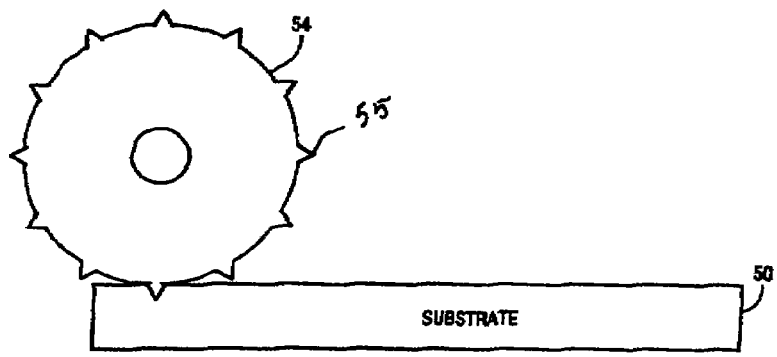
Figure 7L:
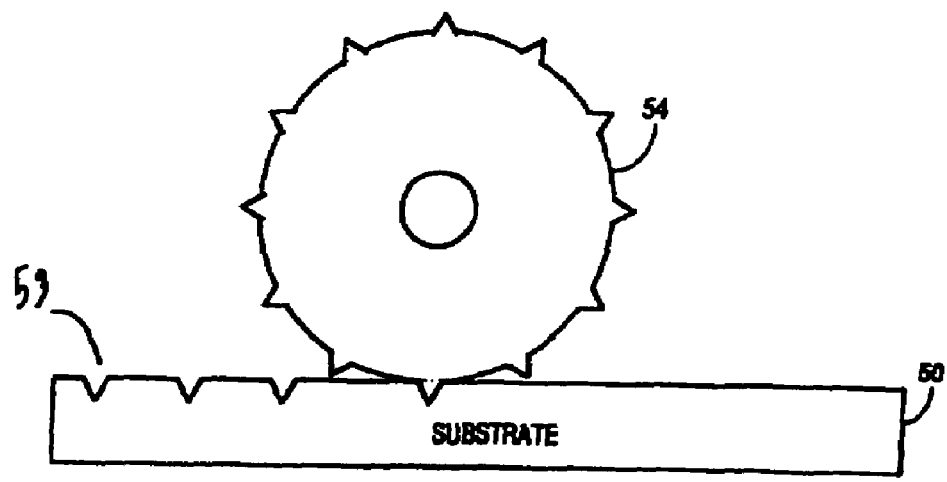
Figure 7M:
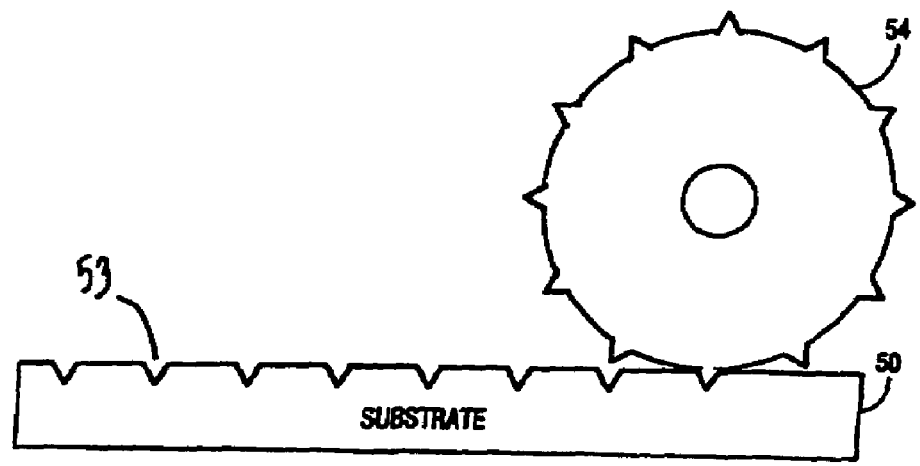

In some embodiments, instead of using a template and a step-and-repeat process to create recessed regions or holes, a roller or a drum 54 with protruding structures 55 is used on a substrate 50 (FIGS. 7I-7M). The substrate 50 can be processed to form recessed regions thereon in a continuous process in which a roller passes across the substrate to form the recessed regions. A similar template to the template 51 can be created and coupled to a roller that can be used to form the recessed regions. A roller 54 may be comprised of sturdy materials (e.g., steel, polymers, aluminum, electroformed nickel, machined copper, rubber, etc.). FIG. 7I shows a roller 54 with the protruding structures 55. FIG. 7J shows a substrate 50 without recessed regions or holes. FIG. 7K shows the roller 54 contacting the substrate 50 in a manner that the protruding structures 55 pressing into the substrate 50. FIGS. 7L-7M show the roller 54 moving across the substrate 50. Recessed regions or holes 53 are created in the substrate 50 after the protruding structures 55 on the roller 54 pierce the substrate 50 and then are removed from the substrate 50 as the roller 54 moves across the substrate 50. It should be noted that a roller includes a web wheel, a drum, or a supported belt.

The substrate 50 can be a sheet substrate or a web substrate as previously mentioned. The roller 54 may be placed so that the roller 54 rolls or moves across and on top of the substrate 50. Alternatively, the roller 54 may be placed so that the roller 54 rolls or moves across and on the bottom of the substrate 50. The substrate 50 may be comprised of polyether sulfone (PES), polysulfone, polyether imide, polyethylene terephthalate, polycarbonate, polybutylene terephthalate, polyphenylene sulfide (PPS), polypropylene, polyester, aramid, polyamide-imide (PAI), polyimide, nylon material (e.g. polyiamide), aromatic polyimides, polyetherimide, polyvinyl chloride, acrylonitrile butadiene styrene (ABS), or metallic materials. Additionally, the substrate 50 when in a web process can be a flexible sheet with very high aspect ratios such as 25:1 or more (length:width). As is known, a web material involves a roll process. For example, a roll of paper towels when unrolled is said to be in web form and it is fabricated in a process referred to as a web process. When a web is coiled, it is in roll form.

Figure 8:
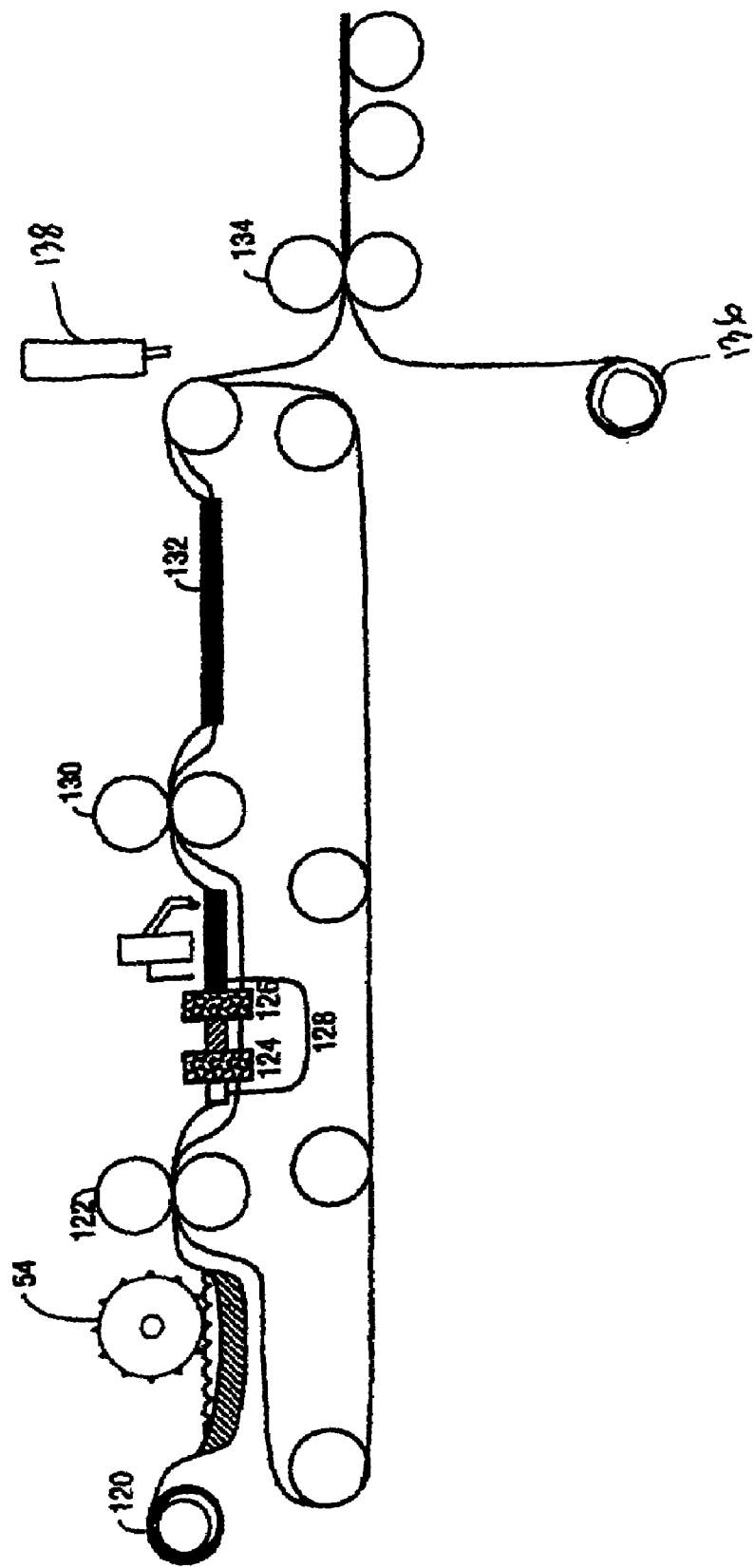
FIG. 8 illustrates an exemplary embodiment of an overall process of making an electronic assembly with functional block in accordance to embodiments of the present invention.

FIG. 8 shows an overall process of fabricating an electronic assembly in according to embodiments of the present invention. Although the discussion below illustrates processes that may be continuous, other separate or sub-processes can also be used. For instance, a process that is continuous as shown in FIG. 8 can be separated into separate or sub-processes. The process in FIG. 8 can take place on one machine or on several machines.

FIG. 8 illustrates a web process where a web substrate is used for forming a plurality of electronic assemblies such as the assembly 200 or 400 previously described. A roll of substrate 120 is provided. The substrate 120 is flexible. The substrate 120 may be sprocket-hole-punched to assist in web handling. The substrate 120 is advanced from a station 117 or a roller 117 to a station 119 that forms a plurality of recessed regions as previously described. The recessed regions can be formed by machining, etching, casting, embossing, extruding, stamping, or molding. In one embodiment, a roller such as the roller 54 as previously described with protruding structures is provided for the formation of the recessed regions. The substrate 120 is advanced through a set of support members 122 as the recessed regions are created into the substrate 120. An fluid self-assembly process can be used to deposit a plurality of functional blocks into the recessed regions formed in the substrate. In one embodiment, a first slurry 124 containing a plurality of functional blocks is dispensed onto the substrate 120. A second slurry 126 containing a plurality of functional blocks may also be used to dispense onto the substrate 120. Excess slurry is collected in container 128 and is recycled. The functional blocks fall into the recessed regions in the substrate. The substrate 120 is then advanced to another set of support members 130. An inspection station (not shown) may be provided to check for empty recessed regions or for improperly filled recessed regions. There may also be a clearing device (not shown) to remove excess functional blocks or blocks not completely seated or deposited into the recessed regions of the substrate 120. A vibration device (not shown) may be coupled to the substrate 120 and/or to the slurry dispensing device to facilitate the distribution and/or of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated by reference in its entirety. In one embodiment, the functional blocks are deposited onto the substrate material using methods described in U.S. patent application Ser. No. 10/086,491. In one embodiment, the functional blocks are deposited onto the substrate using fluidic self-assembly process on a continuously moving web (the substrate 120).

The functional blocks can have shapes such as square, rectangular, trapezoid, cylinder, asymmetric block, asymmetric rectangular, and asymmetric trapezoid. The recessed regions have similar shapes as the functional blocks.

Continuing with FIG. 8, and generally shown at 132, a planarization (or dielectric) layer is then deposited or laminated or otherwise formed onto the substrate material. Vias are formed in the dielectric film. The dielectric layer can be applied using a variety of methods. Most commonly, a solid dielectric film is used, which can be applied with a hot roll laminator. Alternatively, a liquid dielectric could be applied by spin coating in sheet form using any variety of a printing methods, such as direct writing, laser-assisted deposition, screen printing, or wet coating (e.g., by comma coating or other types of roll-to-roll liquid coaters). A liquid dielectric could either be dried or cured to form a solid dielectric layer. Curing could be thermally-activated, moisture-activated, microwave-activated, or UV light-activated. The dielectric layer can be cured or dried in-line as the layer is being formed. In one embodiment, the dielectric film is formed by direct write techniques (e.g., ink-jet printing, digital printing, pen/stylus based deposition, optical or laser assisted deposition, syringe dispense, Xerographic printing, and the like). A direct write device (e.g., an ink-jetting machine) may be provided and controlled by a computer program or machine that can control the selective deposition of the dielectric material. In one embodiment, the deposition of the functional blocks by FSA and the formation of the dielectric film are done on the same machine. In one embodiment, the dielectric film is formed over the functional blocks using the continuously moving web (the substrate 120). In one embodiment, the dielectric layer is selectively applied in only specific locations, e.g., on the substrate areas with the functional blocks and/or over certain area of the functional blocks. In the embodiment where the dielectric layer is selectively deposited, it may assist in adhering the functional blocks in the recesses, and it may not be necessary to form vias.

In one embodiment, to form the vias that can expose the contact pads on the functional blocks, the substrate with the functional blocks deposited therein is inspected by an optical scanner (not shown) prior to via formation to determine the location of the contact pads on the functional blocks that need vias over them. Preferably, this inspection is done in-line with the via formation process, and the image analysis is done automatically by a computerized vision system (not shown), and the results are sent directly to the via formation apparatus to select which vias to form. As a result, vias are only formed in the dielectric above the contact pads of the functional blocks.

The via opening(s) in the dielectric layer can be opened either before or after the dielectric film is placed on the functional blocks-filled substrate. The openings could be punched prior to dielectric layer application to the filled substrate web, or could be created by etching, photolithography, or by laser via drilling after the dielectric film is deposited over the substrate. Laser drilling can be used to form the vias, which could be accomplished with either a UV, visible, or IR laser. In one embodiment, a UV-laser is used to form the via openings in the dielectric layer. Laser via drilling can be accomplished with either a long pulse of energy, or a series of short pulses. In the case of a series of short pulses, the position of the laser can be adjusted so that one or more pulses occur in different positions within each via. A via with a wider, non-circular opening can be created by laser drilling partially through the dielectric film. The vias could also be self-forming in liquid systems that, after application to the functional block-filled substrate web, selectively de-wet off of the contact pads on the functional blocks.

In one embodiment, the substrate 120 is held flat on a chuck, scanned, and then drilled to form a group of vias prior to indexing forward so that another section of the substrate 120 can be treated. The scanning (e.g., optical scanning) and the via drilling may also occur on a moving web when the substrate 120 is moving or moving continuously.

Conductive interconnects are then formed into and on the dielectric film. In one embodiment, the conductive interconnects are formed in a continuously moving web. The conductive interconnects also fill the vias to allow electrical interconnection to the functional blocks. In one embodiment, the vias are filled with a conductive material to form via conductors. A pad conductor is then formed on the dielectric film to interconnect to each via conductor. Each pad conductor and via conductor can form a conductive interconnect and/or be made of the same materials and in one process in many embodiments. The via conductors and the pad conductors can be formed on a continuously moving web of the substrate roll 120. The planarization and the conductive interconnect formation are generally shown at 132 in FIG. 8.

In one embodiment, residues in the vias are removed prior to filling the vias. The cleaning step can be accomplished by treatment with a detergent cleaning system, a water rinse system, an oxygen plasma system, a vacuum plasma system, an atmospheric plasma system, a brush scrubbing system, or a sand or solid carbon dioxide blasting system. The via can be filled with the conductive material using sputtering or evaporation across the entire substrate, followed by lithographic patterning of a mask and subsequent etching, to leave metal only around and in the via. The conductive material in the vias can be formed by any of a variety of conductive composite printing methods, including screen printing or gravure printing. In some embodiments, the conductive material in the vias is formed by a local printing method such as direct write deposition. The conductive material is typically thermally-cured or UV-cured, or cured by air-drying. In other embodiments, the conductive materials in the vias are formed by a direct-write or an adaptive-wiring process (e.g. ink-jet printing, digital printing, pen/stylus based deposition, optical or laser assisted deposition, syringe dispense, Xerographic printing, and the like). In the case of direct-write or adaptive wiring, the positioning of each individual conductive material in each via can be controlled by a machine vision system analogous to the system that is used to locate the position on the dielectric layer to form the vias openings.

Similar methods for forming the conductive material in the vias can be used to form the conductive interconnects on the dielectric film (also referred to as pad conductors) that couple to the via conductors. In some embodiments, the same conductive material is used to fill the via as well as forming the interconnects on the dielectric layer as previously described. In one embodiment, the interconnects are formed by metal sputtering or evaporation across the entire substrate 120, followed by lithographic patterning of a mask and subsequent etching, to leave metal only in the preferred pad conductor shape and in contact with the conductor in the vias. The via conductors and the pad conductors can be formed in one step as forming one continuous conductor.

The via conductors and the pad conductors can be made of one or more of the following: conductive particles dispersed in a nonconductive matrix (e.g., silver ink, sputtered/evaporated metal, conductive carbon composites, carbon nanotubes) or inorganic nanowires dispersed in a nonconductive matrix (e.g., a thermoplastic polymer, a thermoset polymer, or a B-staged thermoset polymer), or any of these materials combined with metallic nanoparticles. The via conductors and the pad conductors' materials are prepared so that they can be deposited on a continuously moving web.

A station 138 may be provided to inspect and/or test the functionality of the assemblies. The assemblies are tested for functionality such that known-bad assemblies can be marked, so that they can be actively avoided in future process steps. Known-good assemblies can be marked, so that they can be actively selected in future process steps. The mark can be an ink mark, ink jet marking, stamping, or a laser burn mark, or any other mark that is detectable by either a human eye, a sensor, or both. In one embodiment, the marking is a laser marking and is applied to the particular pad conductors so as to leave a black mark on the pad conductors. In one embodiment, the tests are done by coupling the electromagnetic energy from the tester to the assemblies. The coupling can be resistive, inductive, or capacitive, or a combination thereof, using contact methods (e.g., direct electrical contact), non-contact methods, or a combination thereof. Even in a densely-packed set of straps, individual assemblies can be tested without undue interference from neighboring devices. In one embodiment, individual assemblies are tested based on a predefined set of criteria or parameters, for instance, one assembly out of every 10 assemblies formed on a web is tested. Other criteria or parameters are of course possible. After the testing, the substrate 120 is further advanced to another set of support members 134 for subsequent processing or lamination processes. In one embodiment, an additional conductive trace is formed on the substrate 120 to interconnect to the conductive interconnect. The conductive trace may be an antenna trace or other conductive element for an external electrical element. The conductive trace may be formed by a convenient method such as printing, laminating, deposition, etc. A roll of material 136 is shown to laminate to the substrate 120. The material from the roll 136 can be a cover a jacket or other suitable material for subsequent processing or for completing the assemblies. In one embodiment, the roll 136 is a device substrate having formed thereon a conductor pattern. The substrate 120 having the functional blocks deposited therein and other elements formed therein/thereon is attached to the substrate from the roll 136 such that the conductive interconnects are coupled to the conductor pattern. In one embodiment, the substrate assemblies after processed as shown in FIG. 8 are singulated or cut to form individual assemblies such as assemblies 200 or 400.

Figure 9:
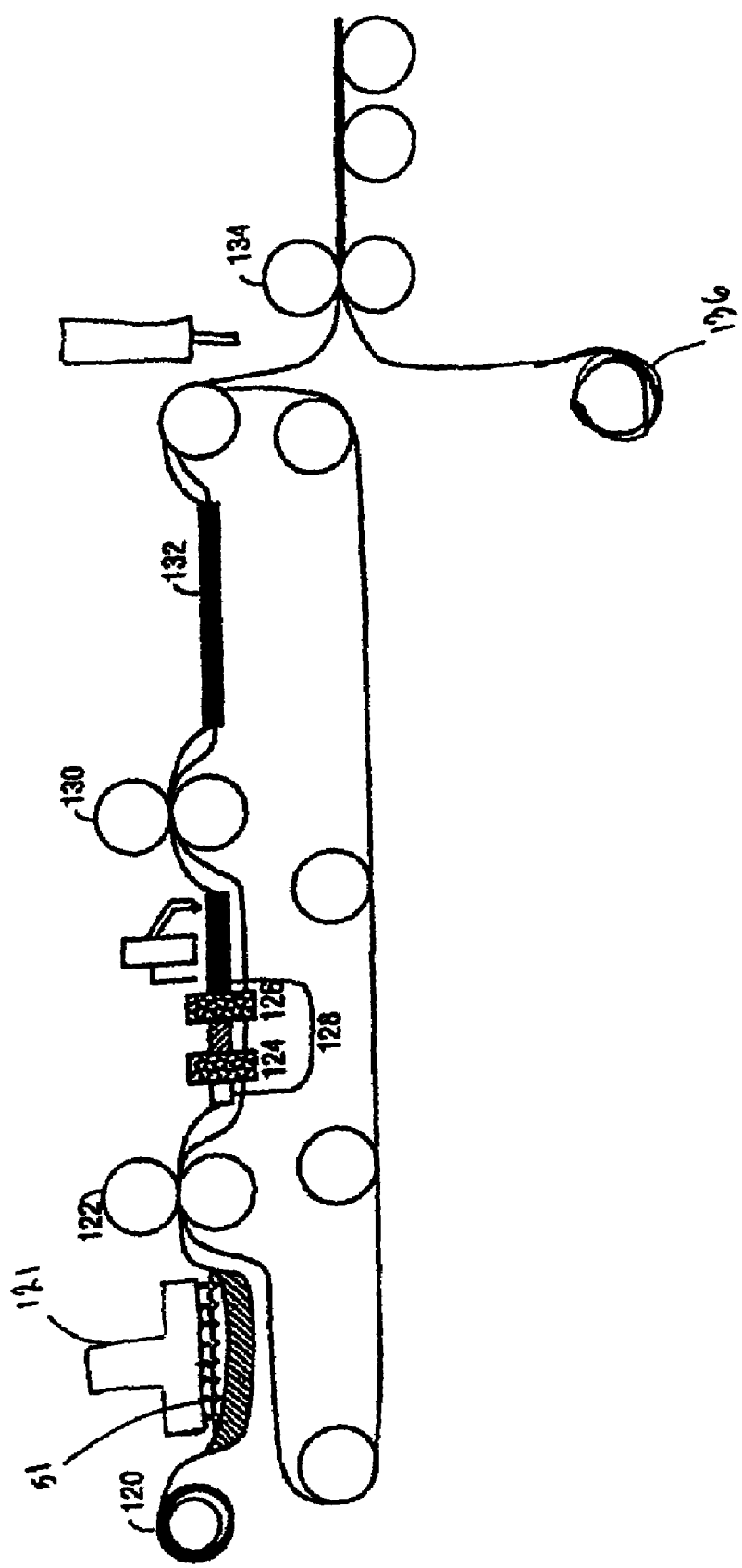
FIG. 9 illustrates another exemplary embodiment of an overall process of making an electronic assembly with functional block in accordance to embodiments of the present invention.

FIG. 9 illustrates another overall process of fabricating an electronic assembly in according to embodiments of the present invention. This process is similar to the one described in FIG. 8 except that the recessed regions on the substrate 120 are formed using a step-and-repeat process. The process in FIG. 9 can be a continuous process as illustrated or can be separated into one or more separate or sub-processes. The process in FIG. 9 can take place on one machine or on several machines.

Similar to FIG. 8, in FIG. 9, a roll of substrate 120 is provided. The substrate 120 material is flexible. The substrate 120 may be sprocket-hole-punched to assist in web handling. The substrate 120 is advanced from the roll 117 to a station 119 that forms a plurality of recessed regions as previously described. In one embodiment, a vertical hot press 121 is provided with a template such as the template 51 previously described for the formation of the recessed regions. The substrate 120 is advanced through a set of support members 122 as the recessed regions are created into the substrate 120. A first slurry 124 containing a plurality of functional blocks is dispensed onto the substrate 120. A second slurry 126 containing a plurality of functional blocks may also be used to dispense onto the substrate 120. Excess slurry is collected in a container 128 and is recycled. The functional blocks fall into the recessed regions in the substrate 120. The substrate 120 is advanced to another set of support members 130. An inspection station (not shown) may be provided to check for empty recessed regions or for improperly filled recessed regions. There may also be clearing device (not shown) to remove excess functional blocks or blocks not completely seated or deposited into the recessed regions off the substrate 120. A vibration device (not shown) may be coupled to the substrate 120 and/or to the slurry dispensing device to facilitate the distribution and/or deposition of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated by reference in its entirety. In one embodiment, the functional blocks are deposited onto the substrate using methods described in U.S. patent application Ser. No. 10/086,491.

Continuing with FIG. 9, and generally shown at 132 a planarization (or dielectric) layer is then deposited or laminated onto the substrate 120 similar to previously discussed. Vias are formed in the dielectric film. Conductive interconnects are then formed on the dielectric film. The conductive interconnects also fill the vias to allow electrical interconnection to the functional blocks. In one embodiment, the vias are filled with a conductive material referred to as a via conductor. A pad conductor is then formed on the dielectric film to interconnect to the via conductor. The pad conductor and the via conductor can form the conductive interconnects in many embodiments. The planarization and the conductive interconnect formation is generally shown at 132 in FIG. 9. A station 138 may be provided to inspect and/or test the functionality of the assemblies as previously described. After the testing, the substrate 120 is further advanced to another set of support members 134 for subsequent processing or lamination processed. In one embodiment, a conductive trace is formed on the substrate 120 to interconnect to the conductive interconnect. The conductive trace may be an antenna trace or other conductive element. The conductive trace may be formed by a convenient method such as printing, laminating, deposition, etc. A roll of material 136 is shown to laminate to the substrate 120. The material can be a cover a jacket or other suitable material to complete the assemblies. In one embodiment, the roll 136 is a device substrate having formed thereon a conductor pattern. The substrate 120 with the functional blocks deposited therein and other elements formed therein/thereon is attached to the substrate roll 136 such that the conductive interconnects are coupled to the conductor pattern. In one embodiment, the substrate assemblies after processed as shown in FIG. 9 are singulated or cut to form individual assemblies such as assemblies 200 or 400.

In one embodiment, a roll of substrate with recessed regions formed therein is formed by joining several sheets of materials together as illustrated in FIGS. 10-11. In many instances, a number of certain predefined sections of the substrate are formed, for example, using a template such as the template 51 previously described. These sections of substrate with the recessed regions formed therein are then spliced, welded, or otherwise attached to one another to form a long section or a roll of substrate. As shown in FIG. 10, frame 1002, 1004, and 1006 are formed. The frame 1002 is formed with a piece of substrate 1008 with a predetermined dimension. Likewise, the frame 1004 are 1006 are also formed with a piece of substrate 1010 and 1012, respectively. Recessed regions 1014 are created into each of the substrates 1008, 1010, and 1012. Then, as shown in FIG. 11, the frames 1002, 1004, and 1006 are welded together to form a long piece of substrate 1020 or a roll of substrate 1020. Between each two frames, a step-change is formed. For example, between the frame 1002 and 1004 is a step-change 1022 and between the frame 1004 and 1006 is a step-change 1024. In the present embodiment, the frames can be attached together such that the step-changes are uniform and consistent from one frame to the next. The present embodiment allows one to control the direction of the step-changes for the benefits previously discussed.

Figure 12:
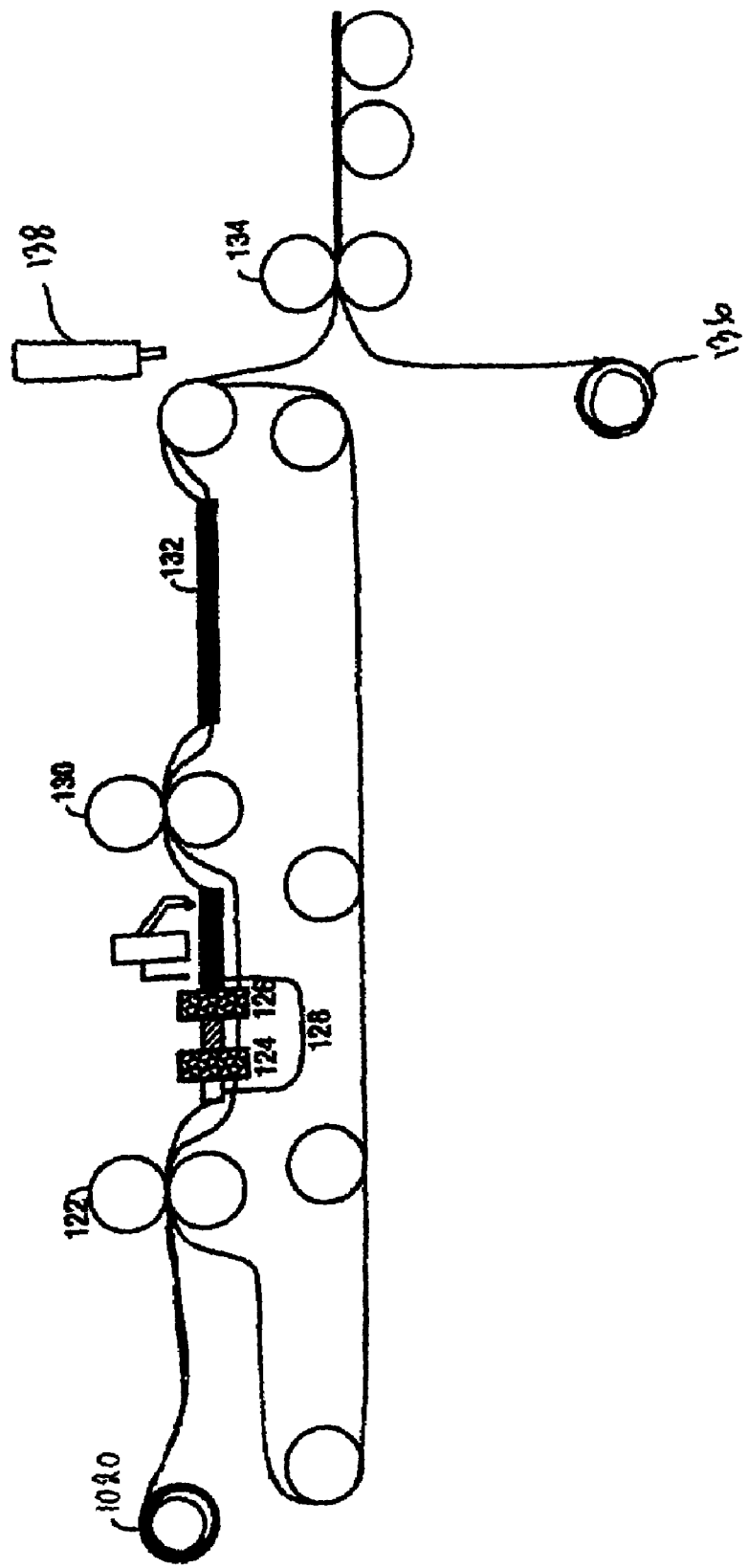
FIG. 12 illustrates an exemplary embodiment of an overall process of making an electronic assembly with functional block in accordance to embodiments of the present invention.

After the substrate 1020 is formed, the substrate 1020 may be rolled up into a roll form and placed on a web line processing similar to those processes described in FIGS. 8-9 to deposit the functional blocks and form other elements on the substrate. As can be seen in FIG. 12, the substrate 1020 is advanced from a roller 117 through a set of support members 122. A first slurry 124 containing a plurality of functional blocks is dispensed onto the substrate 1020. A second slurry 126 containing a plurality of functional blocks may also be used to dispense onto the substrate 1020. Excess slurry is collected in a container 128 and is recycled. The functional blocks fall into the recessed regions in the substrate 1020. The substrate 1020 is advanced to another set of support members 130. An inspection station (not shown) may be provided to check for empty recessed regions or for improperly filled recessed regions. There may also be a clearing device (not shown) to remove excess functional blocks or blocks not completely seated or deposited into the recessed regions off the substrate 1020. A vibration device (not shown) may be coupled to the substrate 1020 and/or to the slurry dispensing device to facilitate the distribution and/or deposition of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated in its entirety. In one embodiment, the functional blocks are deposited onto the substrate using methods described in U.S. patent application Ser. No. 10/086,491.

A planarization (or dielectric) layer is then deposited or laminated onto the substrate 1020. Vias are formed in the dielectric film. Conductive interconnects are then formed on the dielectric film. The conductive interconnects also fill the vias to allow electrical interconnection to the functional blocks. In one embodiment, the vias are filled with a conductive material referred to as a via conductor. A pad conductor is then formed on the dielectric film to interconnect to the via conductor. The pad conductor and the via conductor can form the conductive interconnects in many embodiments. The planarization and the conductive interconnect formation is generally shown at 132 in FIG. 12. A station 138 may be provided to inspect and/or test the functionality of the assemblies as previously described. The substrate 1020 is further advanced to another set of support members 134 for subsequent processing or lamination processed. In one embodiment, a conductive trace is formed on the substrate 1020 to interconnect to the conductive interconnect. The conductive trace may be an antenna trace or other conductive element. The conductive trace may be formed by a convenient method such as printing, laminating, deposition, methods of direct writing, etc. A roll of material 136 is shown to laminate to the substrate 1020. The material can be a cover, a jacket, or other suitable material to complete the assemblies. In one embodiment, the roll 136 is a device substrate having formed thereon a conductor pattern. The substrate 1020 having the functional blocks deposited therein and other elements formed therein/thereon is attached to the roll 136 such that the conductive interconnects are coupled to the conductor pattern. In one embodiment, the substrate assemblies after processed as shown in FIG. 12 are singulated or cut to form individual assemblies such as assemblies 200 or 400. Similar to previously discussed, the process illustrated in FIG. 12 can occur on one machine or on several machines. Additionally, the process illustrated in FIG. 12 can also be separated into one or more sub-processes as opposed to be continuous as shown in this figure.

Figure 13:
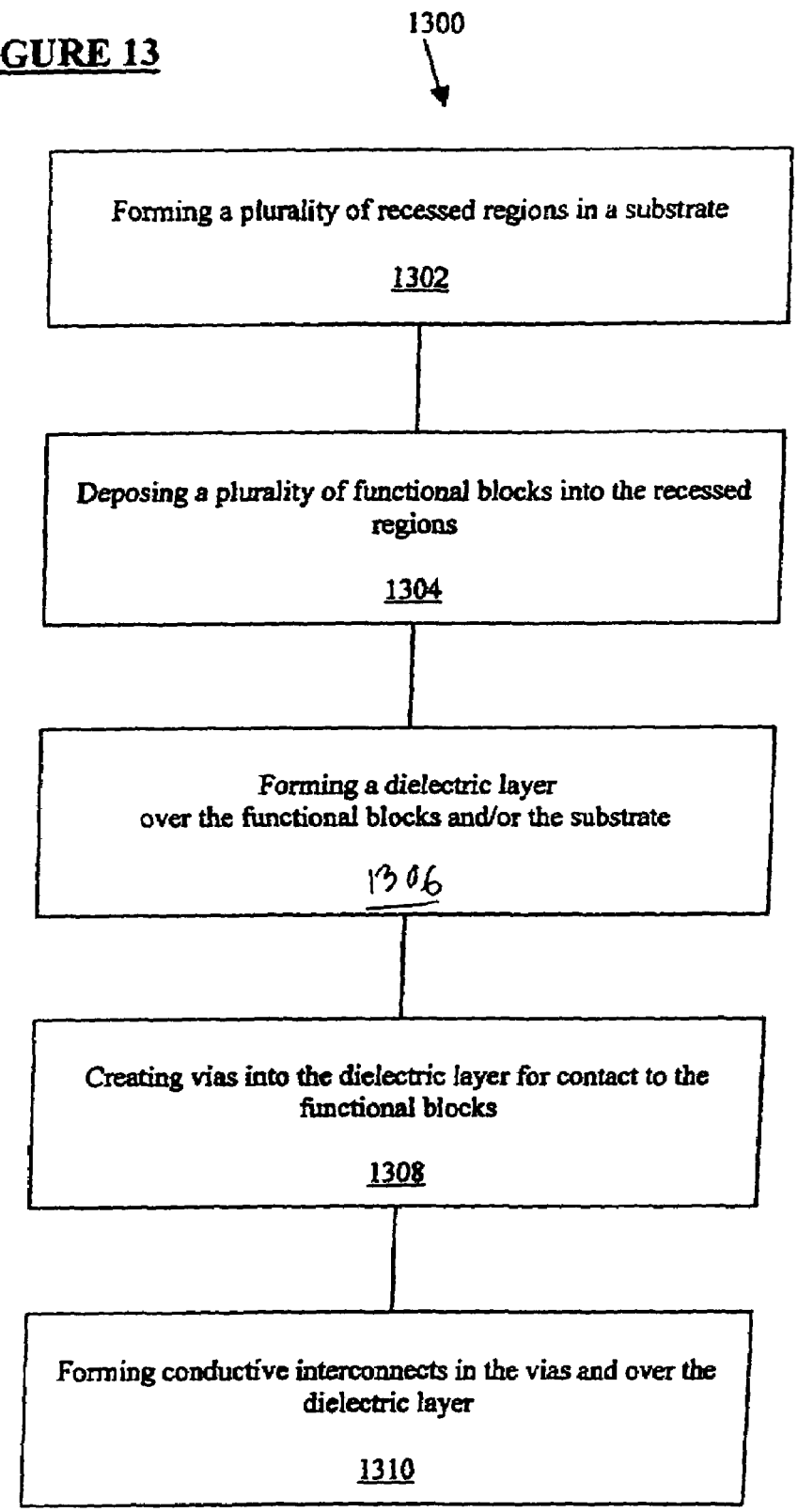

FIG. 13 illustrates an exemplary method 1300 of forming an electronic assembly in accordance to embodiments of the present invention. At box 1302, a plurality of recessed regions is formed on a substrate. At box 1304, a plurality of functional blocks is deposited into the recessed regions. Each of the functional blocks is deposited in one of the recessed regions.

A substantial amount of the plurality of functional blocks is recessed below a top surface of said substrate. Substantial amount is defined by (1) less than 10% of the plurality of the functional blocks protrudes above the top surface of the substrate, (2) less than 1% of the plurality of the functional blocks protrudes above the top surface of the substrate, (3) more than 90% of the plurality of the functional blocks are recessed below the top surface of the substrate, or (4) more than 99% of the plurality of the functional blocks are recessed below the top surface of the substrate.

In one embodiment, each of the recessed regions has a first width-depth aspect ratio and each of the functional blocks has a second width-depth aspect ratio. The first width-depth aspect ratio substantially matches the second width-depth aspect ratio. The first width-depth aspect ratio is one of equal to or less than 10.5:1, or preferably equal to or less than 7.5:1.

A step-and-repeat process can be used to form the recessed regions as previously described. In such process, one area of the substrate is formed with the plurality of recessed regions at a time. In one embodiment, the material web that is used for the substrate is passed under a vertical hot press wherein a mold is attached thereto to form the plurality of recessed regions. At least one area of the substrate is formed with the plurality of recessed regions each time the substrate passes the vertical hot press.

In another embodiment, a continuous process is used to form the recessed regions as previously described. In one embodiment, a material that is used to form the substrate is extruded to form the substrate and while extruding, the plurality of recessed regions is formed into the substrate. In the present embodiment, materials used to form or extrude the substrate such as polymer pellets are heated and extruded to form a melted film. A roller or a template with features provided to form the recessed regions is brought into contact with the melted film. The recessed regions are thus formed into the substrate while it is being extruded.

At box 1306, a dielectric layer is formed over the functional blocks and/or the substrate. At box 1308, vias are created into the dielectric layer to allow contact to the functional blocks or the contact pads on the functional blocks as previously described. At box 1310, conductive interconnects are formed in the vias and over the dielectric layer as previously described to form via conductors and pad conductors.

Figure 14A:
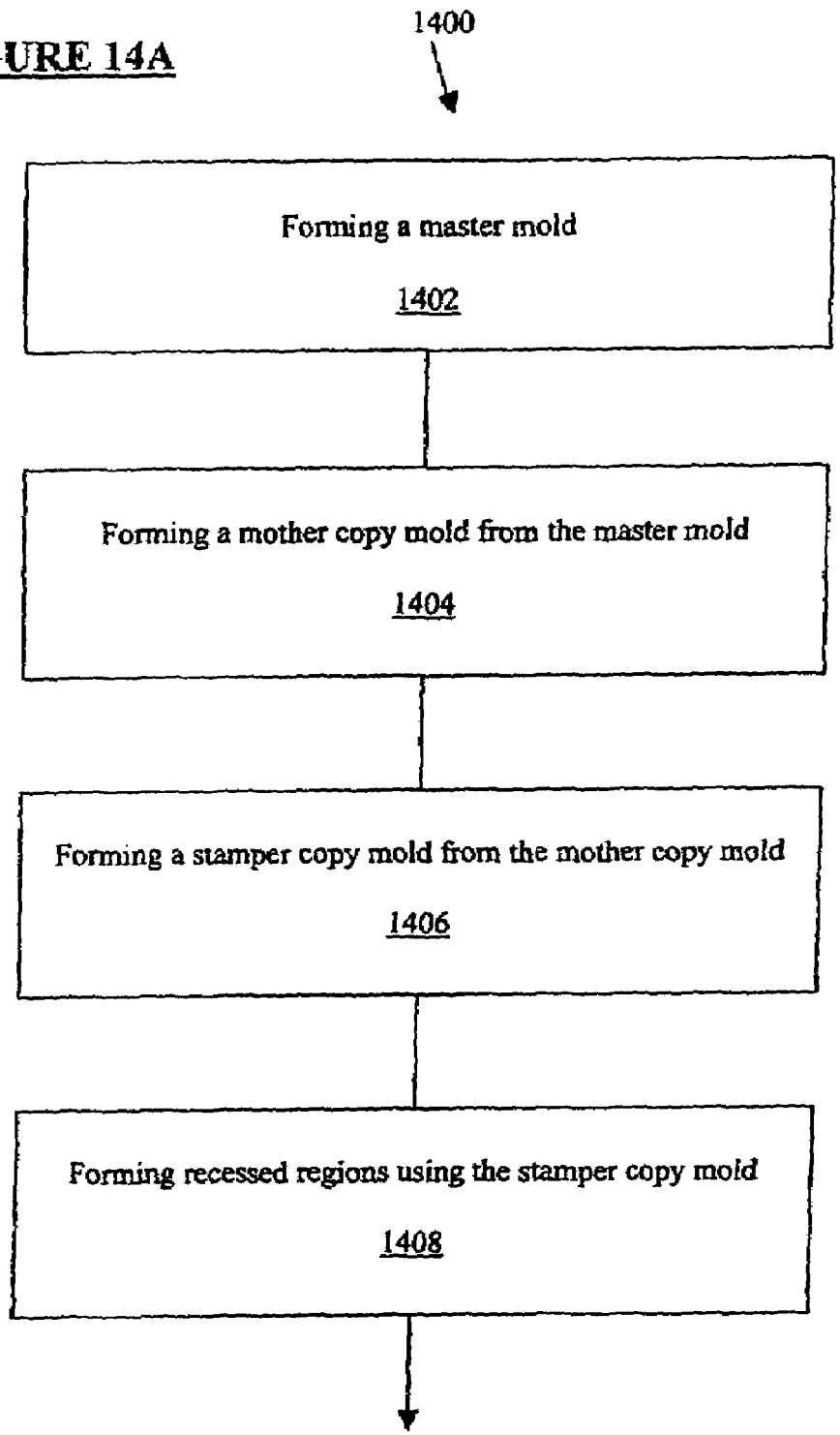
Figure 14B:
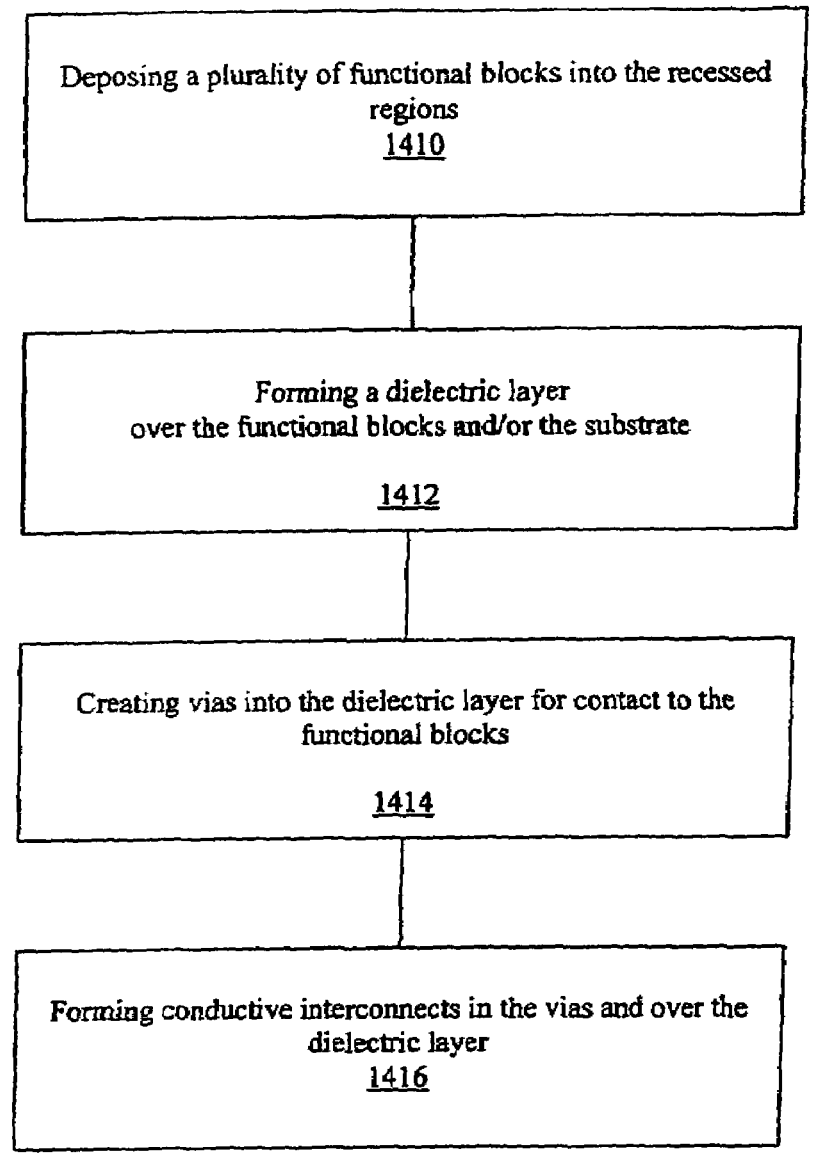

FIGS. 14A-14B illustrate an exemplary method 1400 of forming an electronic assembly in accordance to embodiments of the present invention. The method 1400 is similar to the method 1300 described above with the addition of using copies of an embossing mold to form the recessed regions. At box 1402, a master mold is formed. The master mold comprises an etched silicon wafer and/or a diamond turning machined metal plate. At box 1404, a mother copy mold from the master mold is formed. In the case of a female silicon wafer master, which has receptors rather than embossing features, a father copy mold is made first, and the mother copy mold is made from the father copy mold. At box 1406, a stamper copy mold from the mother copy mold is formed. At box 1408, the stamper copy mold is used to form each of the plurality of recessed regions on a substrate. Each of said master mold, the mother copy mold, the father copy mold and the stamper copy mold comprises feature dimensions provided for each of the plurality of recessed regions. The feature dimensions for each of the plurality of recessed regions are about 0.5-1.0% larger than a desired corresponding feature of each of the plurality of recessed regions. Typically each of the forming steps involves electroforming a nickel plate or shim, but other forming methods, such as molding or casting of metal or polymer are also possible.

In another embodiment, a master mold negative is formed from the master mold. A stamper copy mold or generated is then formed from the master mold negative. At box 1408, the stamper copy mold formed form the master mold negative is used to form each of the plurality of recessed regions.

In another embodiment, one or more stamper copy molds are formed. Each of the stamper copy mold comprises at least one feature for forming one of the plurality of recessed regions. The stamper copy molds are then welded together to form a mold having an array of the features for forming an array of the recessed regions. The features are then used to form an array of the plurality of recessed regions on the substrate.

At box 1410, a plurality of functional blocks is deposited into the recessed regions. Each of the functional blocks is deposited in one of the recessed regions. A substantial amount of the plurality of functional blocks is recessed below a top surface of said substrate. Substantial amount is defined by (1) less than 10% of the plurality of the functional blocks protrudes above the top surface of the substrate, (2) less than 1% of the plurality of the functional blocks protrudes above the top surface of the substrate, (3) more than 90% of the plurality of the functional blocks are recessed below the top surface of the substrate, or (4) more than 99% of the plurality of the functional blocks are recessed below the top surface of the substrate.

At box 1412, a dielectric layer is formed over the functional blocks and/or the substrate. At box 1414, vias are created into the dielectric layer to allow contact to the functional blocks or the contact pads on the functional blocks as previously described. At box 1416, conductive interconnects are formed in the vias and over the dielectric layer as previously described.

FIG. 15 illustrates another exemplary method 1500 of forming an electronic assembly in accordance to embodiments of the present invention. At box 1502, a plurality of sheets of substrates is provided. The sheets comprise of materials that are used for the substrates of a plurality of electronic assemblies. The sheets can be comprised of different, same, or similar materials from one another. The sheets can be differently treated or similarly treated from one another and/or intended for same of different devices. At box 1504, an array of the recessed regions is formed on each sheet. The sheets may all have same types of recessed regions or different types of recessed regions formed therein. At box 1506, the sheets are joined or welded together to form a continuous web of the substrate having formed therein the plurality of recessed regions.

In one embodiment, each of the recessed regions has a first width-depth aspect ratio and each of the functional blocks has a second width-depth aspect ratio. The first width-depth aspect ratio substantially matches the second width-depth aspect ratio. The first width-depth aspect ratio is one of equal to or less than 10.5:1, and optimally equal to or less than 7.5:1.

In one embodiment, a step-and-repeat process using an embossing mold is used to form the recessed regions as previously described. In the present embodiment, each sheet is formed with the plurality of recessed regions at a time. After the recessed regions are formed, the sheets are joined together.

In an alternative embodiment, the sheets are joined together prior to the formation of the recessed regions. Previous methods discussed can be used to form the recessed regions in the joined sheets.

As previously mentioned, when the sheets are joined together, each sheet may be referred to as a frame. Between two frames, there may be a step-change and that one step-change is consistent in direction of change with another step-change from one frame to the next frame (e.g., FIGS. 7G-7H).

At box 1508, a plurality of functional blocks is deposited into the recessed regions. Each of the functional blocks is deposited in one of the recessed regions. A substantial amount of the plurality of functional blocks is recessed below a top surface of said substrate. Substantial amount is defined by any (1) less than 10% of the plurality of the functional blocks protrudes above the top surface of the substrate, (2) less than 1% of the plurality of the functional blocks protrudes above the top surface of the substrate, (3) more than 90% of the plurality of the functional blocks are recessed below the top surface of the substrate, or (4) more than 99% of the plurality of the functional blocks are recessed below the top surface of the substrate.

At box 1510, a dielectric layer is formed over the functional blocks and/or the substrate. At box 1512, vias are created into the dielectric layer to allow contact to the functional blocks or the contact pads on the functional blocks as previously described. At box 1514, conductive interconnects are formed in the vias and over the dielectric layer as previously described.

Many embodiments of the present invention utilize selective deposition of a dielectric layer, a conductive interconnect, or other layer to form a strap assembly. Local printing techniques can be used in various embodiments to effectuate such selective deposition. An example of a local printing technique is direct write, which includes ink jet printing, piezoelectric jet printing, acoustic jet printing, stencil printing, digital printing, pen/stylus based deposition, optical or laser assisted deposition, syringe dispense, Xerographic printing, and the like. A direct write technique is a deposition technique that enables simultaneous deposition and patterning of a material onto a substrate. In one embodiment, ink-jet printing is used with a piezoelectric print head. A direct write system typically employs a guiding system that allows for precise control of where a particular material is to be printed.

Using direct write method to form one or more part of the various layers or components of a strap assembly leads to high throughput since direct write uses only a small amount of material (e.g., conductive ink or dielectric material) to form the layers or components. Another factor influencing the overall cost of a strap is the cost of substrate onto which strap is made. Lower cost material may have high distortion. Screen-printing process with a fixed scale for the screen may not be able to accommodate this difference in scaling. An ink jet system can dynamically correct for this scaling difference. Additionally, even if the deposition process and material can be designed for the particular screen printing machine, it will have low throughput as the system must align itself and printing speed must be lowered to meet the high accuracy requirements. Also, high-resolution screen and material needed to meet high accuracy requirements for a screen-printing process are significantly more expensive than otherwise.

In one embodiment, a direct write technique is used to deposit a dielectric material where it is needed on a functional block that is embedded in a substrate. The same direct write technique can be used to deposit the dielectric material where it is needed on the substrate. In one embodiment, the direct write technique is used to deposits the dielectric material over selected areas of the functional block and the substrate which could be used to bridge or cover a gap from the functional block to the substrate or to protect sensitive area on the functional block. Using the direct write technique to form the dielectric layer where needed reduces fabrication cost and material cost. A guiding system accompanies the direct write process to control where to form the dielectric material.

In one embodiment, a direct write technique is used to form a conductive interconnect to and from the functional block. One advantage of using a direct write technique to form the conductive interconnect is that direct write technique can employ an accurate registration and resolution control system and such registration and resolution control system can look at the substrate and dynamically correct for any scaling error and print a conductive trace away from any contact pads of the functional block. Screen-printing or other printing methods can also be used to form some parts of the conductive interconnect. For instance, the direct write technique can be used to print a via conductor connecting to a contact pad on the functional block and a conductor lead that connects from the via conductor and away from the contact pad; then, a screen-printing process can be used to print a pad conductor that connect to the lead conductor. External interconnections can be connected to this pad conductor as previously discussed.

Figure 16:
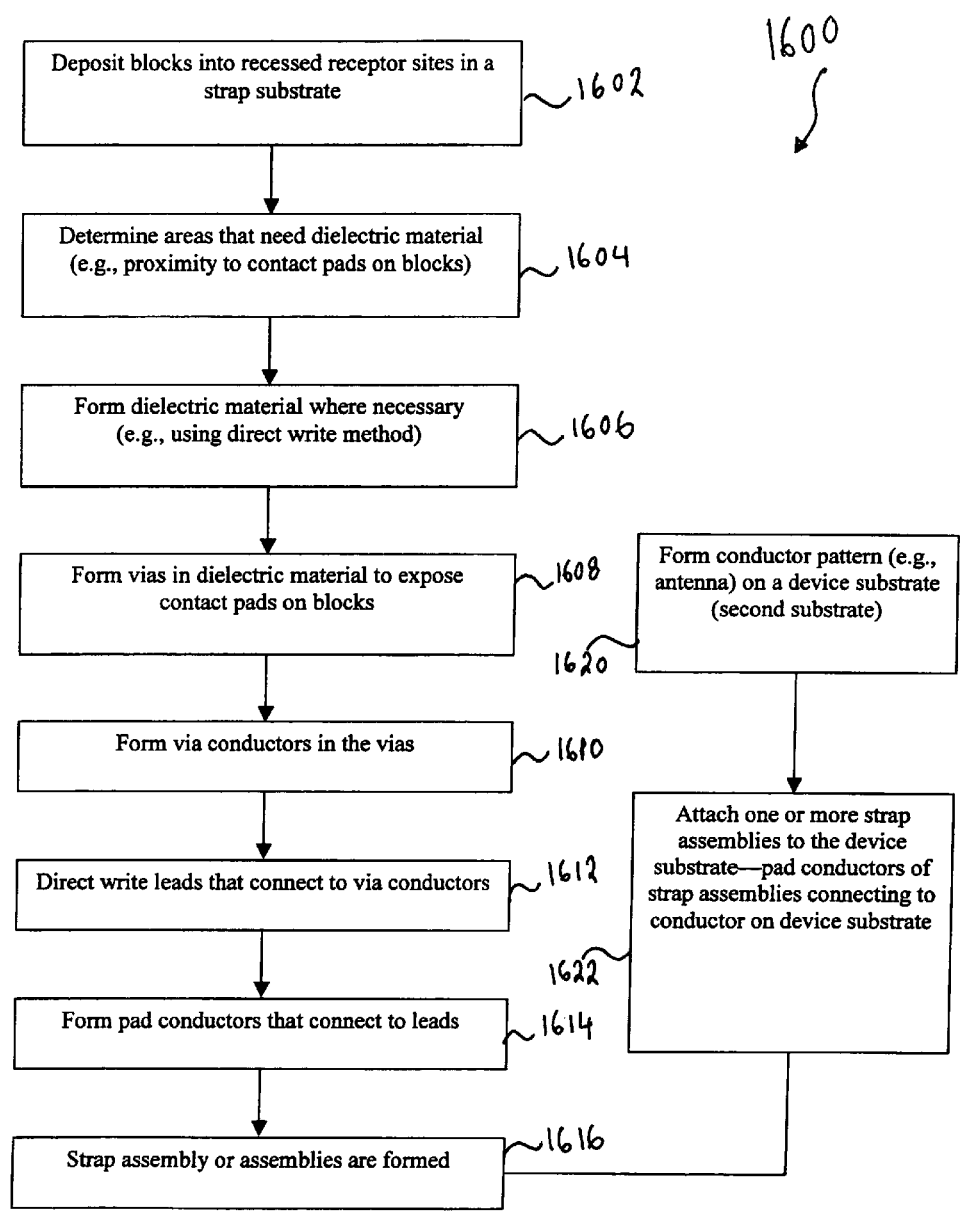

FIG. 16 illustrates an exemplary method 1600 of forming a device in accordance to embodiments of the present invention. Method 1600 incorporates a direct write technique into forming a strap assembly. At box 1602, functional blocks are deposited into recessed receptor sites provided on a strap (first) substrate. (See, for example, FIG. 18B for blocks 1804 being deposited in a strap substrate 1802). At box 1604, areas that need dielectric material to be formed thereon are determined. For example, areas proximate contact pads on the functional blocks or areas that need sealing or bridging from the functional blocks to the substrate surface. At box 1606, the dielectric material is deposited where necessary. (See, for example, FIG. 18B for dielectric material 1806 being selectively deposited where necessary). In one embodiment, a direct write process (e.g., ink-jetting) is used to deposit the dielectric material. At box 1608, vias are formed into the dielectric material where necessary to expose contact pads on the functional blocks. (See, for example, FIG. 18B for vias 1808 being formed into the dielectric material 1806). At box 1610, via conductors are formed in the vias to establish connection to the contact pads. At box 1612, conductor leads are formed using a direct write method. The conductor leads are extensions from the via conductors. At box 1614, pad conductors are formed using any suitable method such as screen-printing or direct write. The pad conductors may have any of the configurations previously discussed (e.g., bow-tie like). The pad conductors allows for easy and convenient electrical interconnection to the conductor leads, to the via conductors, and to the contact pads. At box 1616, strap assemblies are formed. Other processes not listed herein may be necessary to complete the formation of the strap assemblies. Components and layers of the strap assemblies (e.g., blocks, dielectric layers, and interconnections can be formed while the strap substrate is on a continuous web or a continuously moving web, similar to previously discussed.

Parallel to the strap assemblies' forming process, a device substrate is provided. The device substrate can also be a continuous web as previously mentioned. At box 1620, a conductor pattern (e.g., an antenna or elements of an antenna) is formed on a device (second) substrate. Any suitable method can be used to form the conductor pattern. The device substrate may also be provided with the conductor pattern already formed therein (e.g., by a supplier). (See, for example, FIG. 18B for a device substrate 1820 with a conductor pattern 1822). The device substrate may be supplied or provided in a roll format. At box 1622, one or more strap assemblies are attached to the device substrate in a way that the pad conductors are contacting the conductor pattern or part of the conductor pattern (see, for example, FIG. 18B). A conductive adhesive or connector may be used to interconnect the pad conductors to the conductor pattern on the device substrate. An example of a device that can be formed using the method 1600 is an RFID tag.

Figure 17:
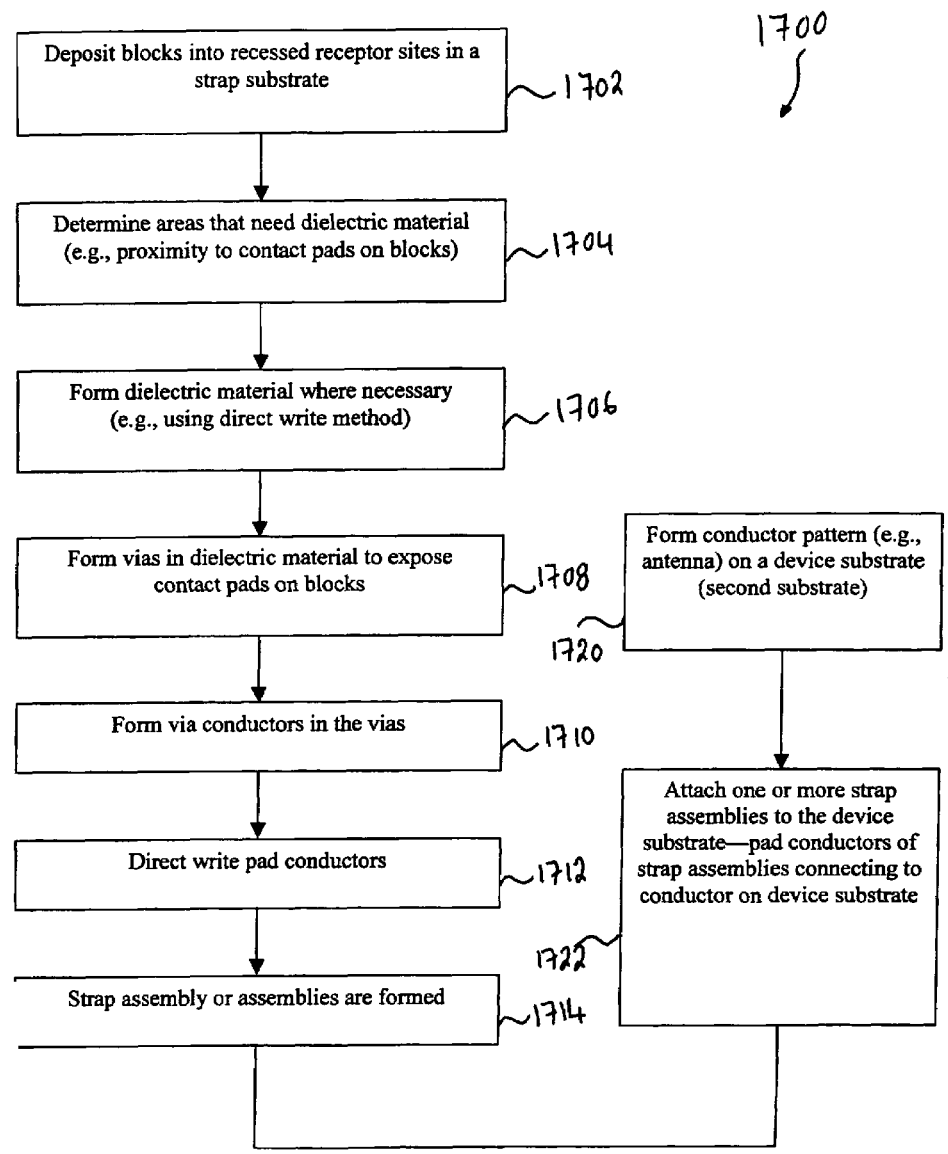

FIG. 17 illustrates an exemplary method 1700 of forming a device in accordance to embodiments of the present invention. Method 1700 is similar to method 1600 except that there a lead conductor is not formed between the via conductor and the pad conductor. At box 1702, functional blocks are deposited into recessed receptor sites provided on a strap (first) substrate. (See, for example, FIG. 18B for blocks 1804 being deposited in a strap substrate 1802). At box 1704, areas that need dielectric material to be formed thereon are determined. At box 1706, a dielectric material is deposited where necessary. (See, for example, FIG. 18B for dielectric material 1806 being selectively deposited where necessary). In one embodiment, a direct write process (e.g., ink-jetting) is used to deposit the dielectric material. At box 1708, vias are formed into the dielectric material where necessary to expose contact pads on the functional blocks. (See, for example, FIG. 18B for vias 1808 being formed into the dielectric material 1806). At box 1710, via conductors are formed in the vias to establish connection to the contact pads. At box 1712, pad conductors are formed using a direct write deposition. The pad conductors may have any of the configurations previously discussed (e.g., bow-tie like). The pad conductors allows for easy and convenient electrical interconnection to the via conductors and to the contact pads. At box 1714, strap assemblies are formed. Other processes not listed herein may be necessary to complete the formation of the strap assemblies. Components and layers of the strap assemblies (e.g., blocks, dielectric layers, and interconnections can be formed while the strap substrate is on a continuous web or on a continuously moving we, similar to previously discussed.

Parallel to the strap assemblies' forming process, a device substrate is provided. The device substrate can also be a continuously web as previously mentioned. At box 1720, a conductor pattern (e.g., an antenna or elements of an antenna) is formed on a device (second) substrate. Any suitable method can be used to form the conductor pattern. The device substrate may also be provided with the conductor pattern already formed therein (e.g., by a supplier). (See, for example, FIG. 18B for a device substrate 1820 with a conductor pattern 1822). The device substrate may be supplied or provided in a roll format. At box 1722, one or more strap assemblies are attached to the device substrate in a way that the pad conductors are contacting the conductor pattern or part of the conductor pattern (see, for example, FIG. 18B). A conductive adhesive or connector may be used to interconnect the pad conductors to the conductor pattern on the device substrate. An example of a device that can be formed using the method 1700 is an RFID tag.

Figures 18A, 18B:
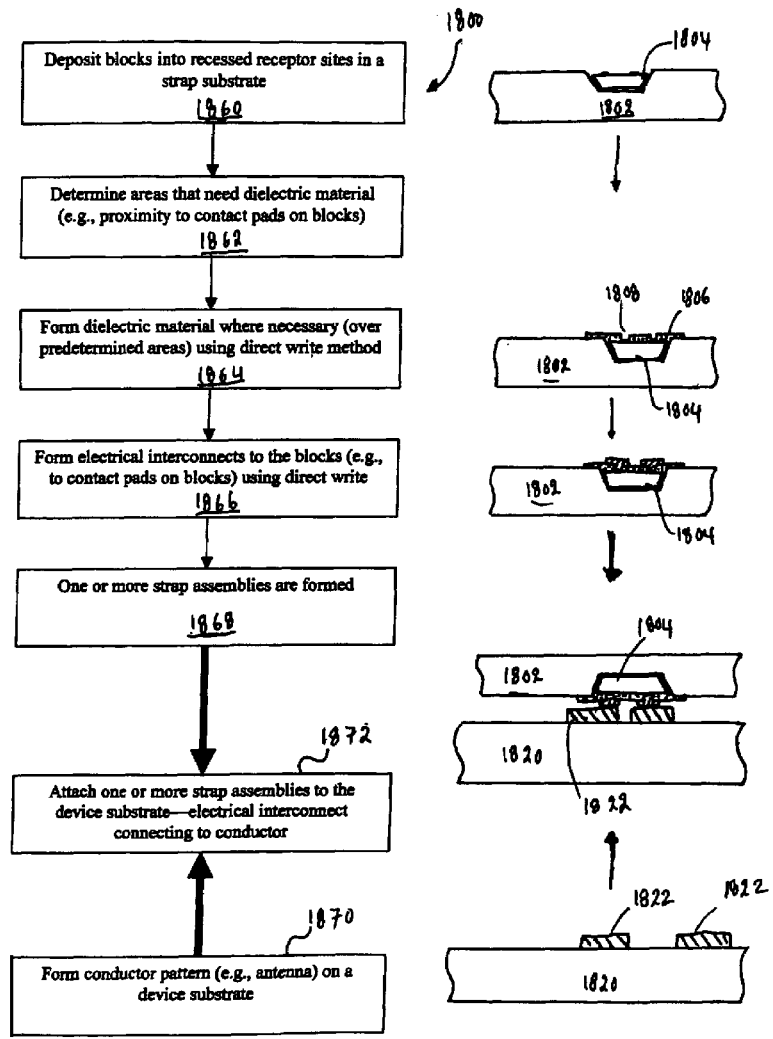

FIG. 18A illustrates an exemplary method 1800 of forming a device in accordance to embodiments of the present invention. Method 1800 is similar to methods 1600 and 1700 except that there a lead conductor is not formed and that an interconnect is formed that acts as both a via conductor and a pad conductor. At box 1860, functional blocks are deposited into recessed receptor sites provided on a strap (first) substrate. (See, for example, FIG. 18B for blocks 1804 being deposited in a strap substrate 1802). At box 1862, areas that need dielectric material to be formed thereon are determined. At box 1864, a dielectric material is deposited where necessary. (See, for example, FIG. 18B for dielectric material 1806 being selectively deposited where necessary). In one embodiment, a direct write process (e.g., ink-jetting) is used to deposit the dielectric material. At box 1866, electrical interconnects are formed to the functional blocks using a direct write method. At box 1868, strap assemblies are formed. Other processes not listed herein may be necessary to complete the formation of the strap assemblies. Components and layers of the strap assemblies (e.g., blocks, dielectric layers, and interconnections can be formed while the strap substrate is on a continuous web or on a continuously moving web, similar to previously discussed.

Parallel to the strap assemblies' forming process, a device substrate is provided. The device substrate can also be a continuously web as previously mentioned. At box 1870, a conductor pattern (e.g., an antenna or elements of an antenna) is formed on a device (second) substrate. Any suitable method can be used to form the conductor pattern. The device substrate may also be provided with the conductor pattern already formed therein (e.g., by a supplier). (See, for example, FIG. 18B for a device substrate 1820 with a conductor pattern 1822). The device substrate may be supplied or provided in a roll format. At box 1872, one or more strap assemblies are attached to the device substrate in a way that the pad conductors are contacting the conductor pattern or part of the conductor pattern (see, for example, FIG. 18B). A conductive adhesive or connector may be used to interconnect the pad conductors to the conductor pattern on the device substrate. An example of a device that can be formed using the method 1800 is an RFID tag.

Figure 19C:
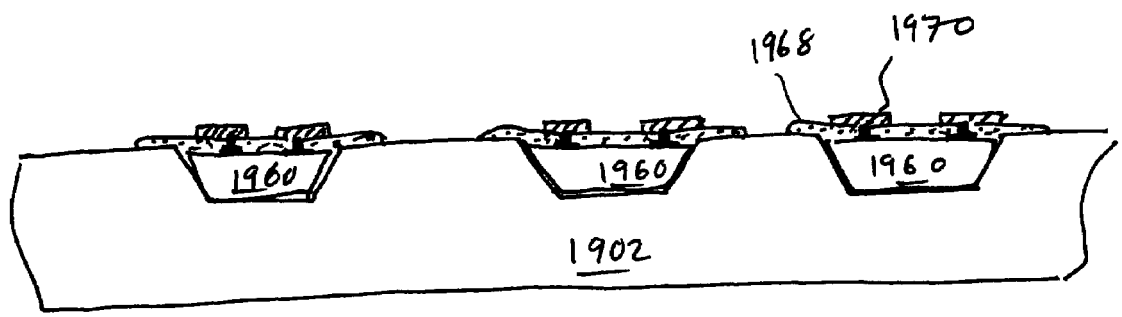

FIG. 19A illustrates an exemplary method 1900 of forming a device in accordance to embodiments of the present invention. At box 1902, functional blocks are deposited into recessed receptor sites provided on a strap (first) substrate using a Fluidic Self-Assembly process. The strap substrate is provided on a web substrate or is part of a web substrate. (See, for example, FIG. 19B for blocks 1960 being deposited in a strap substrate 1962). At box 1904, vias conductors are formed to connect directly to contact pads on the functional blocks using a direct write method (e.g., ink-jetting). (See, for example, FIG. 19B for blocks via conductors 1964 being direct written on contact pads 1966 of the functional blocks 1960). At box 1906, a dielectric layer is formed around each via conductor and optionally, over each predetermined area of each functional block as well as the strap substrate using similar direct write method. (See, for example, FIG. 19B for dielectric layer 1968 being form around the via conductor 1966). As before, the dielectric material is deposited where necessary. At box 1908, pad conductors are formed to connect to the via conductors. A direct write method (or other suitable method) can be used to form the pad conductors. (See, for example, FIG. 19C for pad conductors 1970 being formed and connected to the via conductor 1966). The pad conductors may have any of the configurations previously discussed (e.g., bow-tie like). At box 1910, strap assemblies are formed. Other processes not listed herein may be necessary to complete the formation of the strap assemblies. The process of method 1900 can all occur while the web substrate is continuously moving from one station to another station where each station performs a particular process, e.g., FSA, direct write conductive material, or direct write dielectric material.

In one embodiment, at box 1912, the web material with the strap assemblies formed thereon is singulated to form individual strap assemblies. In other words, individual assemblies are singulated, sliced, cut, or otherwise separated from one another or from the web substrate. Parallel to the strap assemblies' forming process, a substrate device is provided.

At box 1916, a conductor pattern (e.g., an antenna or elements of an antenna) is formed on a device (second) substrate. Any suitable method can be used to form the conductor pattern. The device substrate may also be provided with the conductor pattern already formed therein (e.g., by a supplier) as previously described. The device substrate may also be supplied in the form of a web roll. Also at box 1916, the strap assemblies are attached to the device substrate in a way that the pad conductors are contacting the conductor pattern or part of the conductor pattern as previously described. A conductive adhesive or connector may be used to interconnect the pad conductors to the conductor pattern on the device substrate. An example of a device that can be formed using the method 1900 is an RFID tag. A plurality of strap assemblies or just one strap assembly may be attached to one individual device substrate depending on applications. Several strap assemblies may be attached to one individual device substrate and then singulated to form individual final devices each having a strap assembly and a device substrate attached to one another.

In an alternative embodiment, at box 1914, parallel to the strap assemblies' forming process, a substrate device is provided. At box 1914, a conductor pattern (e.g., an antenna or elements of an antenna) is formed on a device (second) substrate. Any suitable method can be used to form the conductor pattern. The device substrate may also be provided with the conductor pattern already formed therein (e.g., by a supplier) as previously described. The device substrate may be supplied in the form of a web roll. The strap assemblies are attached to the device substrate in a way that the pad conductors are contacting the conductor pattern or part of the conductor pattern as previously described. A conductive adhesive or connector may be used to interconnect the pad conductors to the conductor pattern on the device substrate. At box 1918, the web material with the strap assemblies attached to the device substrate is singulated to form individual final devices. In other words, individual devices are singulated, sliced, cut, or otherwise separated from one another or from the web substrate. A plurality of strap assemblies or just one strap assembly may be attached to one individual final device depending on applications. An example of a device that can be formed using the method 1900 is an RFID tag.

Figure 20:
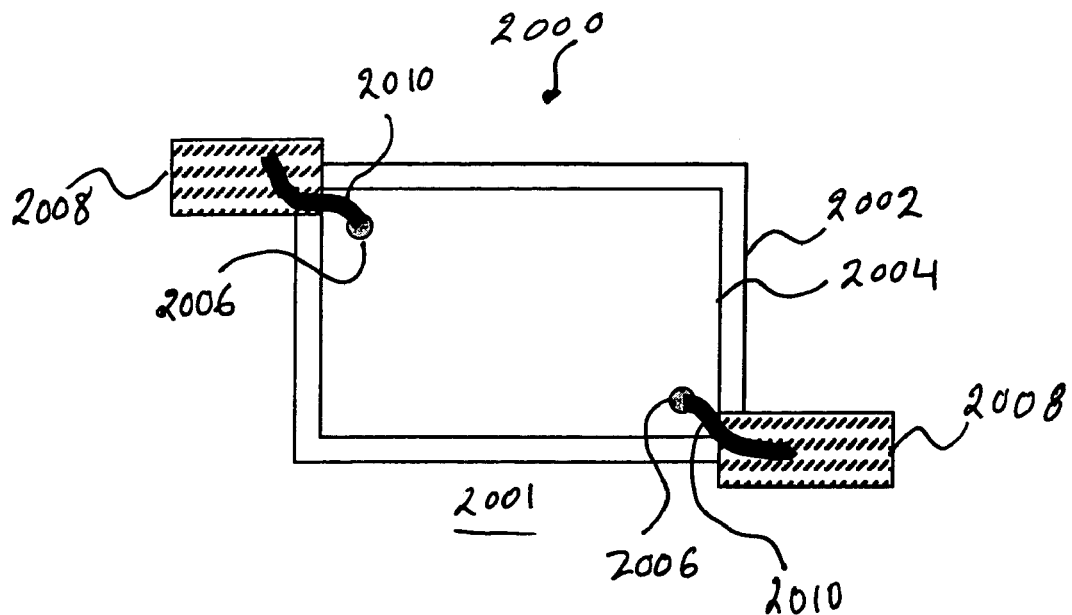
FIGS. 20-24 illustrate exemplary electronic assemblies formed in accordance to methods of the present invention.

FIGS. 20-23 illustrates how layers and components are selectively formed on a functional block and optionally, a substrate that the functional block is deposited therein. FIG. 20 illustrates a functional block 2004 being deposited into a receptor site 2002 formed on a substrate 2001 as previously discussed. The functional block 2004 includes one or more contact pads 2006 to allow for electrical interconnections to the functional block 2004. As previously discussed, in one embodiment, the functional block 2004 is recessed below a surface of the substrate 2000. A lead conductor 2010 is formed that connects to the contact pads and extends away from the contact pads 2006. A direct write technique (e.g., ink jetting) is used to form the lead conductor 2006, in one embodiment. In one embodiment, the lead conductor 2006 connects to a pad conductor 2008 formed on the substrate 2002. Thus, a direct write technique is used to form the lead conductors 2006 that can re-route and expand the contact pads 2006 of the functional blocks 2004. Although not shown in FIG. 20, a dielectric layer may be selectively formed over the functional blocks using a suitable method such as direct write. Then, the pad conductor 2008 is formed on the dielectric layer and connected to the lead conductor 2010. A strap assembly 2000 is formed when all proper interconnections are formed for the functional block 2004.

Figure 21:
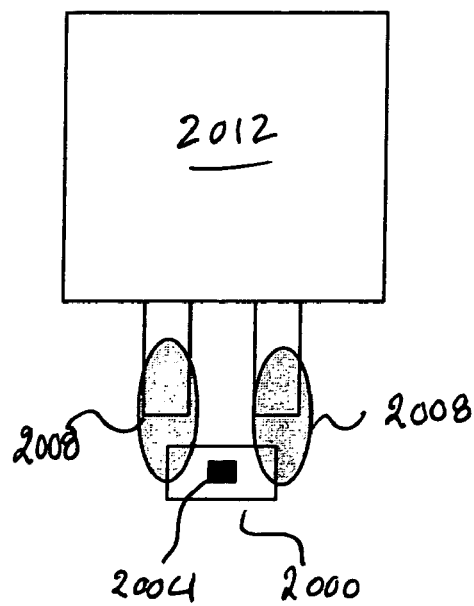

In FIG. 21, the strap assembly 2000 is attached or coupled to an electrical or conductor pattern 2012 that may be provided on a second substrate or a device substrate. As shown in this figure, a conductive material 2008 is formed to make the electrical connection between the strap assembly 2000 and the electrical pattern 2012. The conductive material 2008 can be part of the pad conductor 2006 formed in the strap assembly. The electrical pattern 2012 can be parts of an antenna or the antenna itself.

Figure 22:
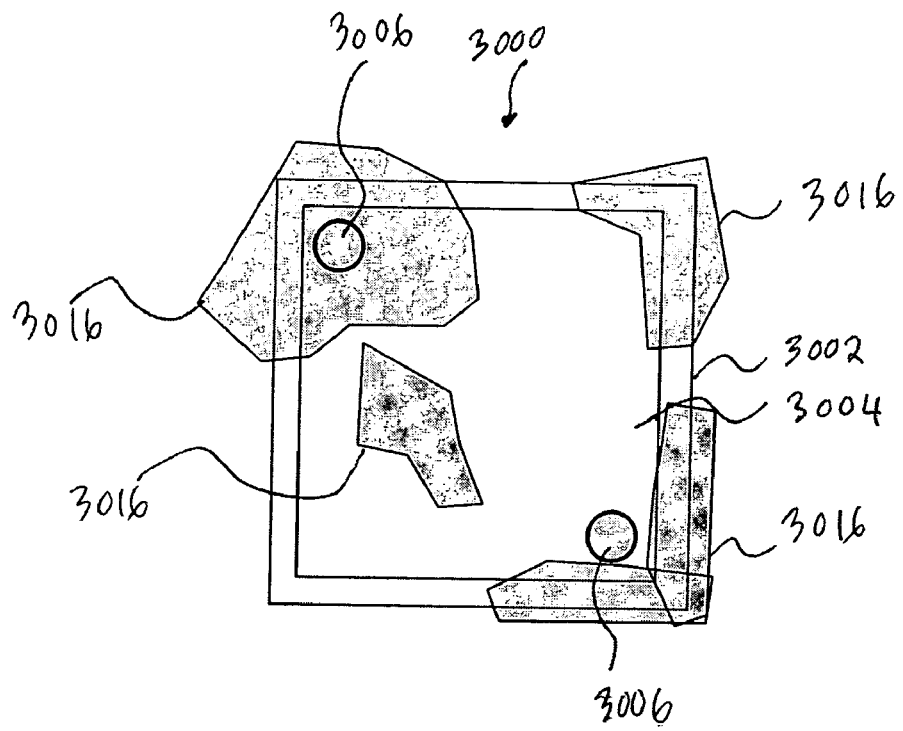
Figure 23:
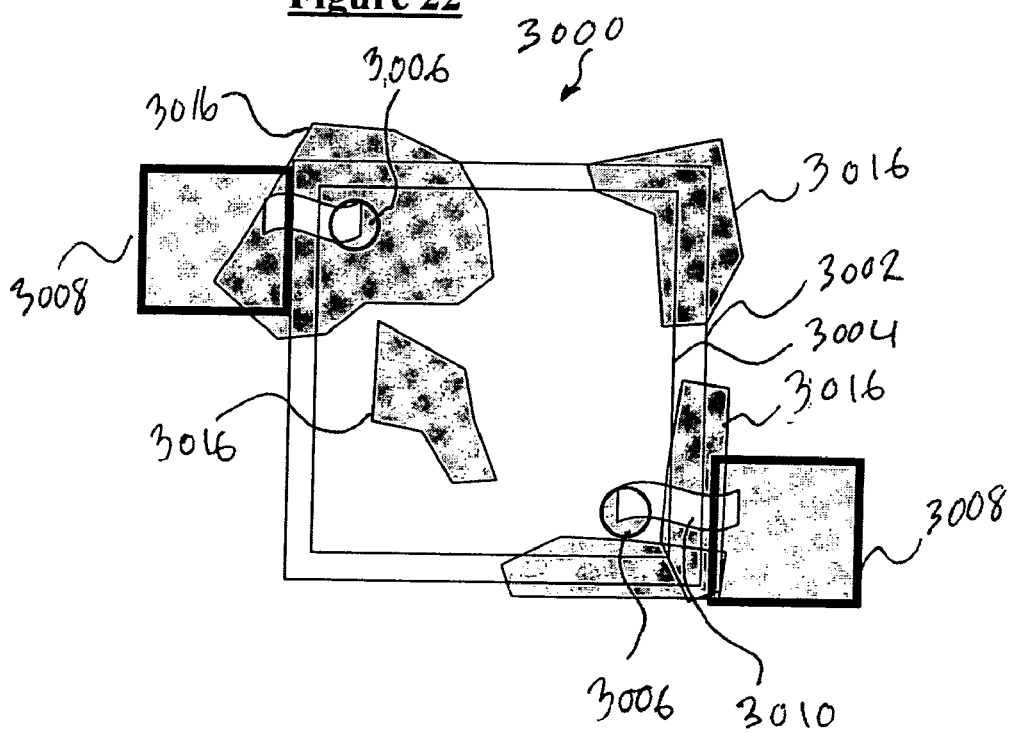
Figure 24:
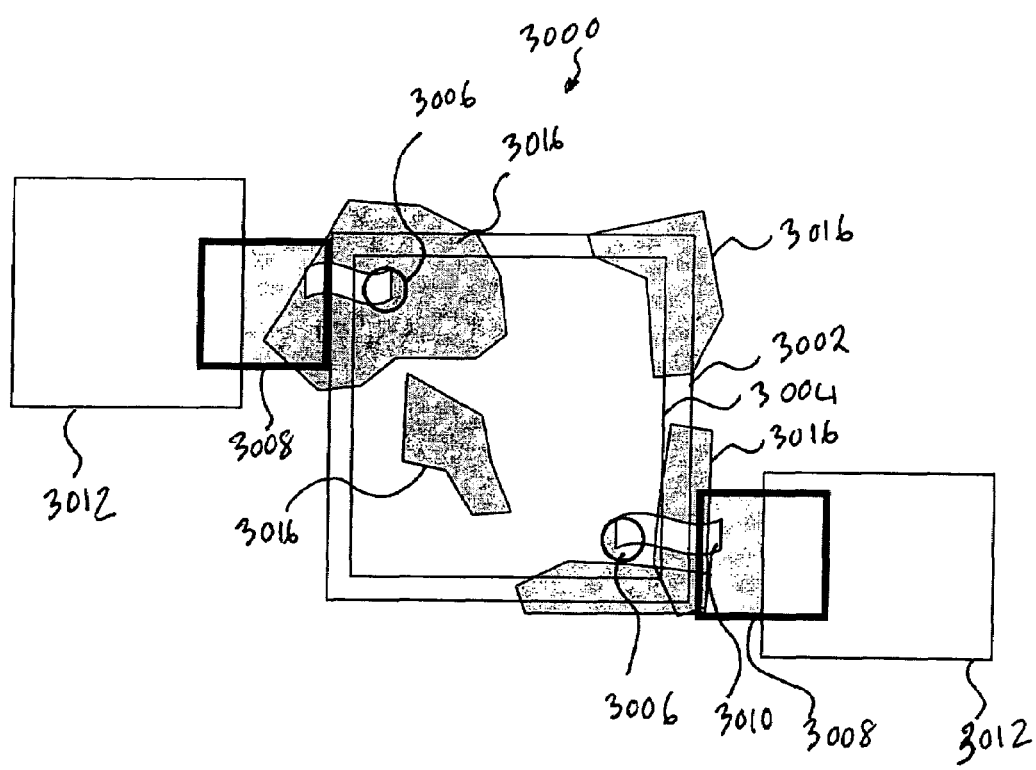

FIGS. 22-24 illustrate an example of forming a strap assembly that includes using a direct write technique and coupling the strap assembly to an external device. In FIG. 22, a direct write technique, such as ink-jet, laser assisted deposition, etc, is used to deposit a dielectric material 3016 on the functional block 3004 where it is needed. The dielectric material 3016 could be placed anywhere it is needed. For example, the dielectric material 3016 is used to bridge the gap from the functional block 3004 to the substrate film 3002, or to protect sensitive areas on the functional block 3004. The dielectric material 3016 is also placed over areas that includes contact pads 3006 provided on the functional block 3004. Vias (not shown) may be created in the dielectric material 3016 to expose the contact pads 3006 to allow for necessary electrical connections. Conductive material (not shown) is then used to fill the vias (forming via conductor) and contact the contact pads 3006 using a direct write method as previously discussed. Alternatively, the conductive material may be formed over the contact pads 3006 using a direct write method followed by the dielectric material 3016 being formed around the conductive material.

In FIG. 23, lead conductors 3010 are formed to provide extensions to the contact pads 3006 (either directly, through via conductors, or both) as previously discussed. A direct write method can be used to form the lead conductors 3010. Pad conductors 3008 are then formed on the substrate and optionally on portions of the dielectric material 3016. Each pad conductor 3008 is interconnected to a lead conductor 3010 and in one embodiment, the pad conductor 3008 does not reside over a surface of the respective functional block. A strap assembly 3000 is formed all the necessary interconnections and layers are made and formed to and from the functional block 3004.

In one embodiment, the strap assembly 3000 is attached to a second substrate or a device substrate that has a conductor pattern 3012 formed thereon (FIG. 24). For instance, the strap assembly 3000 is attached to a substrate that has an RFID antenna formed thereon to form an RFID tag. The strap assembly 3000 is attached to the second substrate such that the conductor pattern 3012 on the second substrate is interconnected to the pad conductors 3008 on the strap assembly 3000. In one embodiment, the strap assembly 3000 is flipped up-side-down (like a "flip-chip format") onto the second substrate so that the pad conductors 3008 are facing the conductor pattern 3012 on the device substrate. The conductor pattern 3012 can be any functional electrical pattern or feature on a device substrate.

Figure 25:
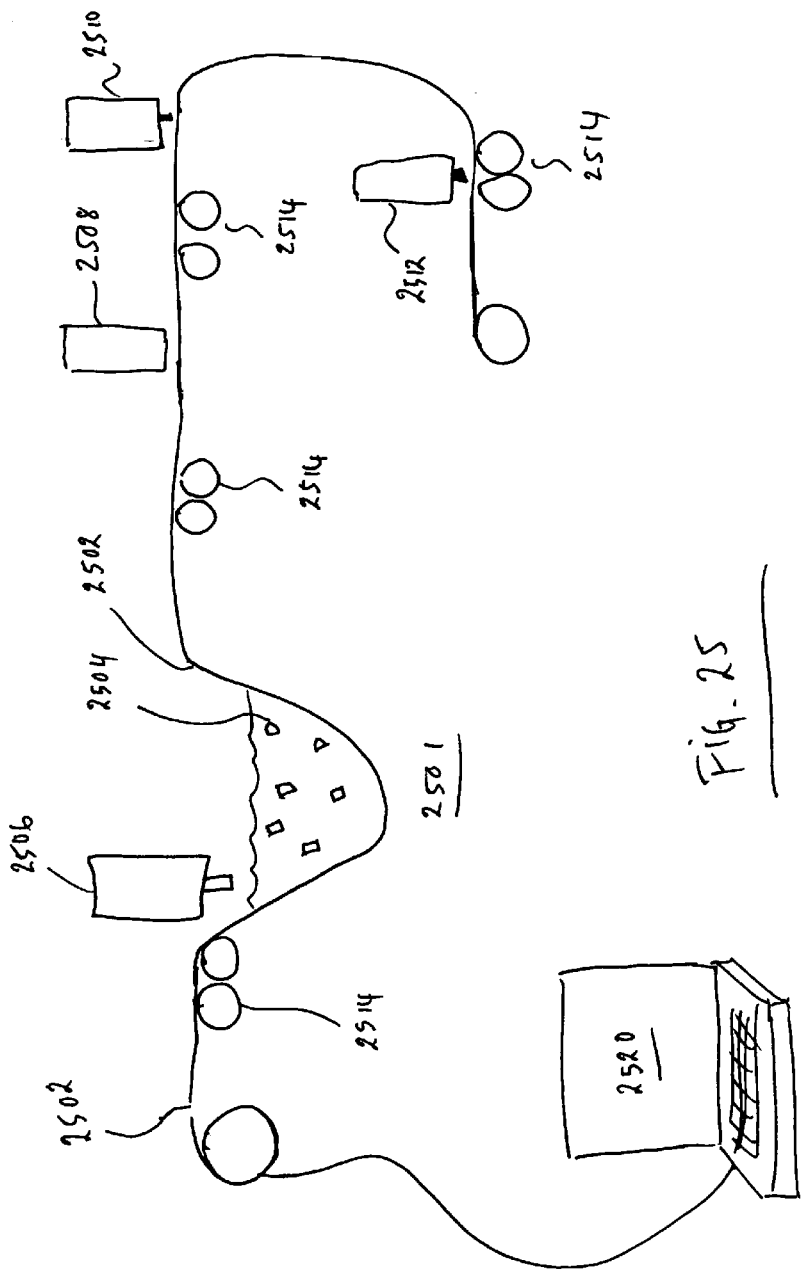
FIG. 25 illustrates an exemplary processing system that can be used with some embodiments of the present invention.

While many processing systems can be used to carry out certain embodiments of the present invention, FIG. 25 illustrates an exemplary processing system 2500 that can be used to assemble functional blocks 2504 into a strap substrate that has receptor regions configured to receive the functional blocks as well as forming layers or components on the substrate or the functional blocks. The system 2500 is similar to those described in FIGS. 8-12 above with the specific incorporation of a direct write device into the system to form a certain layer of component of the strap assembly. The system 2500 comprises a web-processing line 2501 configured to and able to move a roll of substrate material 2502 across one or more processing stations. A set of support rollers 2514 is provided to facilitate the movement of the substrate material from one station t another station. The substrate material 2502 can form or be made to include or supports the strap substrate that the functional blocks are to be deposited therein. The system 2500 includes a Fluidic Self-Assembly (FSA) device 2506 (at one station) configured to deposit the functional blocks 2504 into the recessed regions. In one embodiment, the substrate material 2502 is submerged under the fluid used in the FSA process while the blocks are being deposited. In one embodiment, a portion of the FSA device is also submerged under the fluid. An inspection device or station 2508 may be provided to inspect the substrate material, e.g., for block filling, empty regions, block functionality, etc.

A first direct write device 2510 is also provided (at one station) with the system 2500. The first direct write device 2510 can be any one of an ink-jetting system, a digital printing system, pen/stylus system, optical or laser assisted deposition system, syringe dispensing system, Xerographic printing system, and the like configured to formed interconnection features (e.g., via conductors, pad conductors, or lead conductors) to and from the functional blocks.

A second direct write device 2512 is also provided with the system 2500 (at one station). The second direct write device can also be any one of an ink-jetting system, a digital printing system, pen/stylus system, optical or laser assisted deposition system, syringe dispensing system, Xerographic printing system, and the like configured to formed dielectric material over a selected area upon command. More direct write devices or stations may be included for several layers as previously discussed.

In one embodiment, the system 2500 further includes a vibration device (not shown) positioned to exert a vibrational force on one or both of the substrate material and the slurry or fluid that is used to dispense the functional blocks onto the substrate material. The vibration device can also be positioned t exert such force on the FSA dispensing device. The vibration device facilitates deposition of the functional blocks in the receptor regions. The substrate material could also be tilt in any direction and/or angle that further assists the deposition of the functional blocks. In one embodiment, a vibration device is coupled to the FSA device 2506. In one embodiment, a vibration device is placed proximate the substrate material 2502 so that the substrate material is vibrated during deposition at the FSA station.

Other stations (not shown) could be included, for example, additional stations are provided for the deposition of pad conductors, or other necessary layers over the substrate material or the dielectric layer. Although not shown, the system 2500 could be made to include an embossing device configured to create the recessed regions into the substrate material. The embossing device would be placed ahead of the FSA device 2506 so that the embossing may take place prior to the deposition of the functional blocks.

The processing system 2500 can include or connect to a computer system 2520 that is set up to control for example, the web-processing line, the FSA device, the first direct writing device, the second direct writing device, the embossing device and other devices of the system 2500. In one embodiment, the computer system 2520 may include a system controller (not shown) that can executes a system control software, which is a computer program stored in a computer-readable medium such as a memory (not shown). Preferably, the memory is a hard disk drive, but the memory may also be other kinds of memory known in the art. The computer program includes sets of instructions that dictate the process of the system 2500. An input/output device such as a monitor, a keyboard, and/or a mouse is used to interface between a user and the computer system 2520. For instance, a set of instruction can be executed by the computer system 2520 to move the substrate material across the web processing line for FSA, for interconnections formation, for direct write processing, et . . . .

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A method comprising:
depositing a functional block into a recessed region, said recessed region formed on a first substrate, said depositing occurs on the first substrate being a continuous web line and using a Fluidic Self Assembly process, said functional block has a width-depth aspect ratio that substantially matches a width-depth aspect ratio of said recessed region which is one of equal to or less than 10.5:1, and equal to or less than 7.5:1;
forming a dielectric layer selectively over at least one of a selected portion of said functional block and a selected portion of said first substrate;
forming one or more electrical interconnections to said block; and
attaching said first substrate to a second substrate having formed thereon a conductor pattern, wherein said one or more electrical interconnections are interconnecting to said conductor pattern.

2. The method of claim 1 further comprising:
attaching said first substrate to a second substrate having formed thereon a conductor pattern, wherein said one or more electrical interconnections are interconnecting to said conductor pattern, and wherein said first substrate is attached to said second substrate in a flip-chip format.

3. The method of claim 1 wherein said first substrate is part of a first web material, wherein said second substrate is part of a second web material, and wherein said method further comprising:
cutting said first substrate and said second substrate from said web materials after said first substrate is attached to said second substrate.

4. The method of claim 1 further comprising:
forming the dielectric layer using a direct writing technique.

5. The method of claim 4 wherein said pad conductors are formed by direct writing.

6. The method of claim 1 further comprising:
forming vias in the dielectric layer where necessary to electrically connect to the functional block.

7. The method of claim 1 further comprising:
forming vias in the dielectric layer where necessary to electrically connect to the functional block;
forming via conductors in the vias;
forming leads that connect to the via conductors using a direct write technique; and
forming pad conductors that connect to said leads.

8. The method of claim 7 wherein said via conductors are formed by a direct write technique.

9. The method of claim 1 further comprising:
forming vias in the dielectric layer where necessary to electrically connect to the functional block;
forming via conductors in the vias; and
forming pad conductors that connect to said via conductors, said pad conductors are formed using a direct write technique.

10. The method of claim 1 wherein depositing said functional block into said recessed region, forming said dielectric layer, and forming said interconnections occur on a continuously moving process and on a same machine.

11. The method of claim 1 further comprising:
forming a lead conductor that connects to a contact pad provided on the functional block using a direct write technique; and
forming a pad conductor that connects to said lead conductor.

12. The method of claim 11 wherein said pad conductor is formed by direct writing.

13. The method of claim 11 further comprising:
coupling said pad conductor to a conductor pattern formed on a second substrate.

14. The method of claim 1 further comprising:
forming a pad conductor that connects to a contact pad provided on the functional block using a direct write technique to establish electrical interconnection to the functional block.

15. The method of claim 14 wherein said pad conductor is formed by direct writing.

16. The method of claim 14 further comprising:
coupling said pad conductor to a conductor pattern formed on a second substrate.

17. The method of claim 1 further comprising:
forming said recessed region on said first substrate prior to depositing said functional block into said recessed region, wherein forming said recessed region, depositing said functional block, forming said dielectric layer, and forming said interconnections occur on a continuously moving process and on a same machine.

18. A method comprising:
depositing a functional block into a recessed region, said recessed region formed on a first substrate, said depositing occurs on a continuous web line and using a Fluidic Self Assembly process, said functional block has a width-depth aspect ratio that substantially matches a width-depth aspect ratio of said recessed region which is one of equal to or less than 10.5:1, and equal to or less than 7.5:1:
forming dielectric layer selectively over at least one of a selected portion of said functional block and a selected portion of said first substrate;
forming one or more electrical interconnections to said block; and
coupling said functional block to an antenna formed on a second substrate and
coupling said electrical interconnections to said antenna.

19. A method comprising:
depositing a functional block onto a web substrate configured to receive said functional block;
using direct writing to form a dielectric layer over a selected area of at least one of said functional block or said web substrate;
forming one or more interconnects to said functional block; and
coupling said functional block to an antenna formed on a second substrate and coupling said electrical interconnections to said antenna.

20. The method of claim 19 wherein said web substrate moves continuously during depositing said functional block, forming said dielectric layer, and forming said interconnects.

21. The method of claim 19 wherein said functional block has a shape selected from a group consisting of square, rectangular, trapezoid, cylinder, and wherein said shape is symmetrical or asymmetrical.

22. The method of claim 19 wherein said interconnects are formed using a direct writing technique.

23. The method of claim 19 wherein forming said interconnects further comprising:
forming one or more vias into said dielectric layer;
forming a via conductor in each of said vias; and
forming a pad conductor coupled to said via conductor.

24. The method of claim 19 wherein any one or both of said via conductor and said pad conductor are formed using a direct writing technique.

25. The method of claim 19 wherein said via conductor is formed by direct writing on said functional block prior to said dielectric layer being formed, wherein said dielectric layer is formed around said via conductor, and wherein said pad conductor is formed after said dielectric layer is formed.

26. The method of claim 19 wherein said web substrate includes one or more sections, each of said sections comprises a plurality of recessed receptors, and each of said sections is separated from another one of said section by a step-change that is consistent and uniform from one step-change to the next.

27. The method of claim 19 further comprising:
forming a lead conductor that connects to a contact pad provided on the functional block using a direct write technique; and
forming a pad conductor that connects to said lead conductor.

28. The method of claim 27 wherein said pad conductor is formed by direct writing.

29. The method of claim 17 further comprising:
forming a pad conductor that connects to a contact pad provided on the functional block using a direct write technique to establish electrical interconnection to the functional block.

30. The method of claim 29 wherein said pad conductor is formed by direct writing.

31. The method of claim 30 further comprising:
coupling said pad conductor to a conductor pattern formed on a second substrate.

32. The method of claim 19 further comprising:
forming a recessed region on said web substrate prior to depositing said functional block into said recessed region, wherein forming said recessed region, depositing said functional block, forming said dielectric layer, and forming said interconnections occur on a continuously moving process and on a same machine.

33. The method of claim 19 wherein the functional block is deposited onto the web substrate using a Fluidic Self Assembly process, and wherein the web substrate includes a recessed region configured to receive the functional block.

34. The method of claim 33 wherein the depositing of said functional block, the forming of said dielectric layer and the forming of said interconnects occur on a same machine.

35. The method of claim 33 wherein the functional block comprises an integrated circuit for an RFID and wherein the functional block, after being deposited, forms an RFID strap.

36. A method comprising:

depositing a functional block onto a web substrate configured to receive said functional block;

using direct writing to form a dielectric layer over a selected area of at least one of said functional block or said web substrate;

forming one or more interconnects to said functional block;

forming a lead conductor that connects to a contact pad provided on the functional block using a direct write technique;

forming a pad conductor that connects to said lead conductor; and coupling said pad conductor to a conductor pattern formed on a second substrate.

* * * * *